US012581637B2

(12) United States Patent
Fishburn et al.

(10) Patent No.: US 12,581,637 B2
(45) Date of Patent: Mar. 17, 2026

(54) METHODS AND STRUCTURES FOR THREE-DIMENSIONAL DYNAMIC RANDOM-ACCESS MEMORY

(71) Applicant: Applied Materials, Inc., Santa Clara, CA (US)

(72) Inventors: Fredrick David Fishburn, Aptos, CA (US); Arvind Kumar, Austin, TX (US); Sony Varghese, Manchester-by-the-Sea, MA (US); Chang Seok Kang, Santa Clara, CA (US); Sung-Kwan Kang, San Jose, CA (US); Tomohiko Kitajima, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 932 days.

(21) Appl. No.: 17/674,353

(22) Filed: Feb. 17, 2022

(65) Prior Publication Data

US 2022/0285362 A1 Sep. 8, 2022

Related U.S. Application Data

(60) Provisional application No. 63/157,137, filed on Mar. 5, 2021.

(51) Int. Cl.
*H10B 12/00* (2023.01)
*G11C 5/10* (2006.01)

(52) U.S. Cl.
CPC .............. *H10B 12/05* (2023.02); *G11C 5/10* (2013.01); *H10B 12/03* (2023.02); *H10B 12/30* (2023.02)

(58) Field of Classification Search
CPC ........ G11C 5/10; H10B 12/03; H10B 12/033; H10B 12/05; H10B 12/30; H10B 12/482; H10B 12/488
See application file for complete search history.

(56) References Cited

U.S. PATENT DOCUMENTS

| | | | |
|---|---|---|---|
| 7,609,551 | B2 | 10/2009 | Shino et al. |
| 8,339,828 | B2 | 12/2012 | Yamazaki et al. |

(Continued)

FOREIGN PATENT DOCUMENTS

| | | |
|---|---|---|
| JP | 2001102549 | 4/2001 |
| JP | 2013175717 A1 | 9/2013 |
| KR | 10-2020-0007594 A | 1/2020 |

OTHER PUBLICATIONS

PCT International Search Report and Written Opinion for PCT/US2022/018110 dated Feb. 28, 2022.

*Primary Examiner* — Britt Hanley
*Assistant Examiner* — Kevin Quinto
(74) *Attorney, Agent, or Firm* — Moser Taboada

(57) ABSTRACT

Methods for forming three-dimensional dynamic random-access memory (3D DRAM) structures that leverage a grid pattern of high aspect ratio holes to form subsequent features of the 3D DRAM. The method may include depositing alternating layers of crystalline silicon (c-Si) and crystalline silicon germanium (c-SiGe) using an heteroepitaxy process onto a substrate and HAR etching of a pattern of holes into the substrate. The holes configured to provide chemistry access to laterally etch or deposit materials to form 3D DRAM features without requiring subsequent HAR etching of holes to form the 3D DRAM features.

15 Claims, 23 Drawing Sheets

(56)  References Cited

U.S. PATENT DOCUMENTS

|            |        |         |                   |             |
| ---------- | ------ | ------- | ----------------- | ----------- |
| 8,363,452  | B2     | 1/2013  | Yamazaki et al.   |             |
| 8,785,266  | B2     | 7/2014  | Yamazaki          |             |
| 10,283,513 | B1     | 5/2019  | Zhou et al.       |             |
| 2013/0051150 | A1   | 2/2013  | Roizin et al.     |             |
| 2019/0164985 | A1   | 5/2019  | Lee et al.        |             |
| 2019/0244933 | A1   | 8/2019  | Or-Bach et al.    |             |
| 2019/0326123 | A1   | 10/2019 | Li et al.         |             |
| 2020/0083225 | A1   | 3/2020  | Ma et al.         |             |
| 2020/0098571 | A1   | 3/2020  | Matsuo            |             |
| 2020/0286903 | A1   | 9/2020  | Cui et al.        |             |
| 2020/0365609 | A1   | 11/2020 | Harari et al.     |             |
| 2021/0013210 | A1   | 1/2021  | Lee et al.        |             |
| 2022/0254784 | A1* | 8/2022  | Lee ........................ | H10B 12/02 |

* cited by examiner

100

200

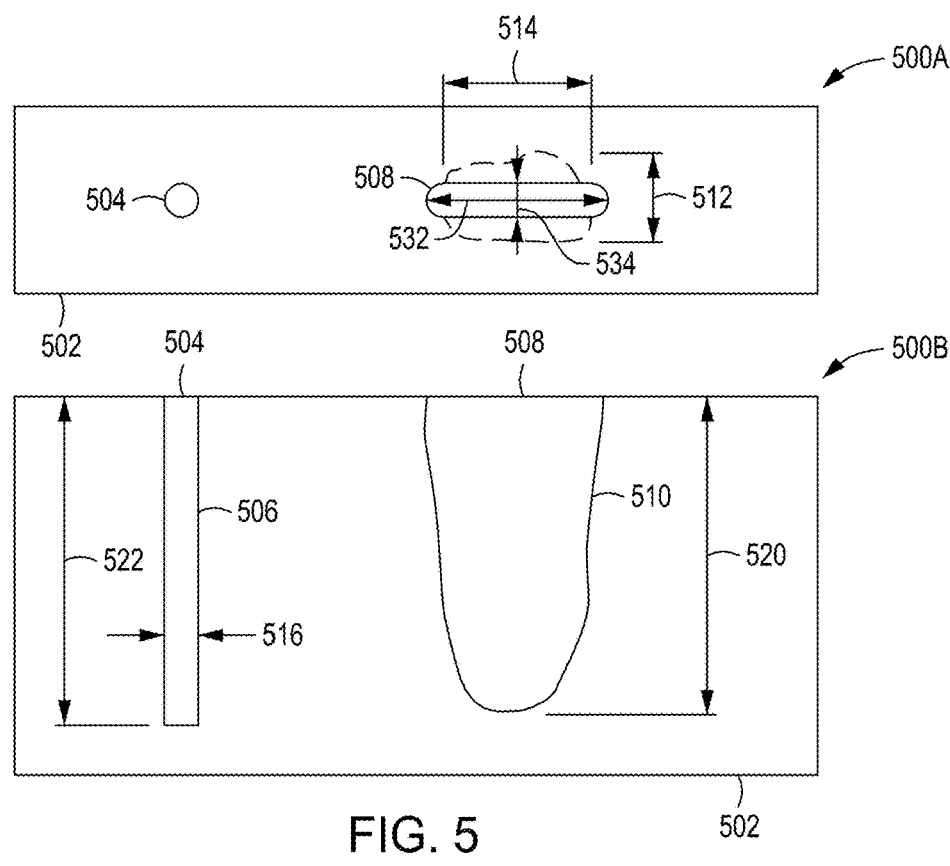
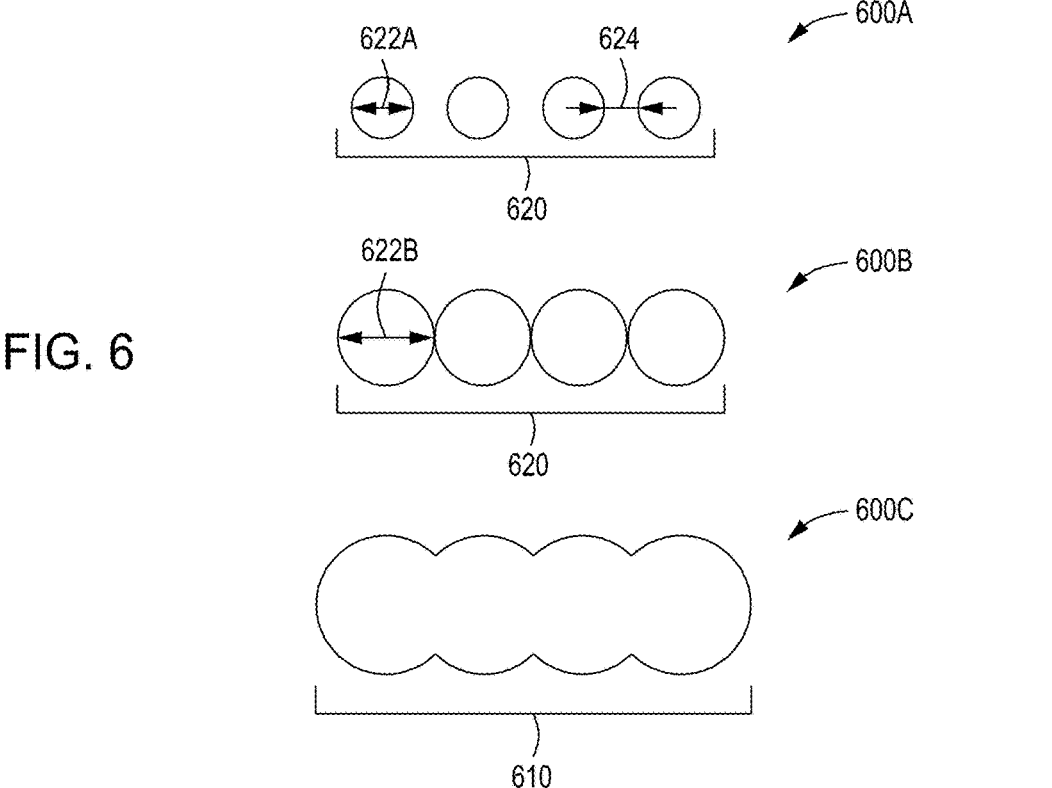
FIG. 5
FIG. 6

1000
FIG. 10
704
706A
802
902
706A
1100
1104
FIG. 11
1102
704
706A
902
1104
706A
1104
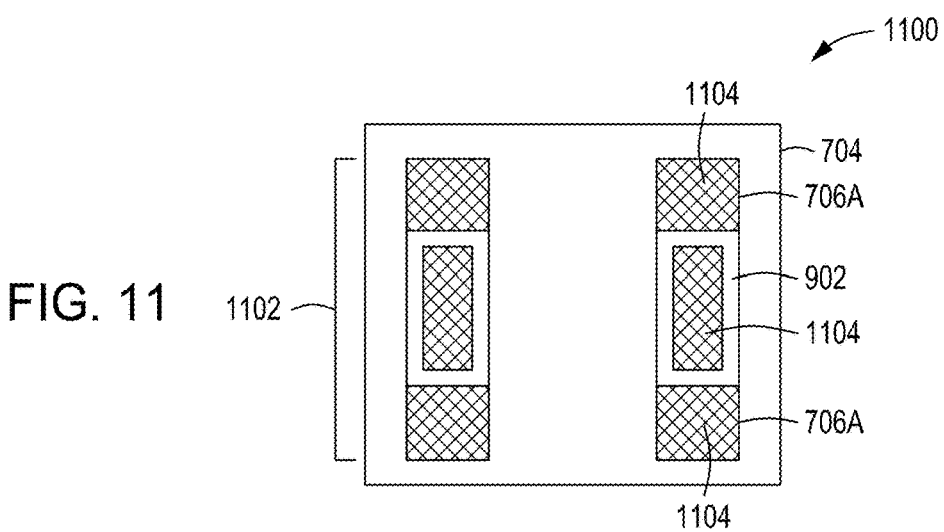
1200
1204
1104
FIG. 12
1202
704
706A
802
706A
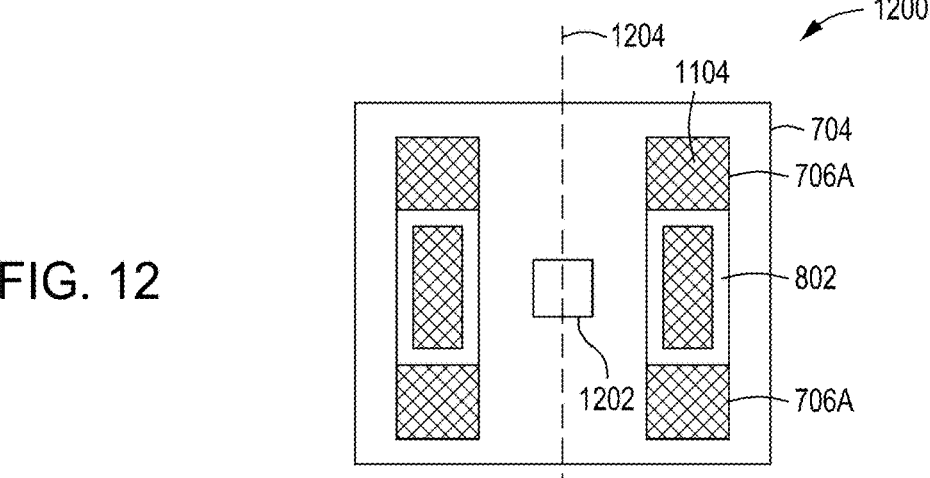

METHODS AND STRUCTURES FOR THREE-DIMENSIONAL DYNAMIC RANDOM-ACCESS MEMORY

CROSS-REFERENCE TO RELATED APPLICATIONS

This application claims the benefit of the U.S. provisional patent application Ser. No. 63/157,137, filed Mar. 5, 2021, which is herein incorporated by reference in its entirety.

FIELD

Embodiments of the present principles generally relate to semiconductor manufacturing.

BACKGROUND

The storage and retrieval of data has been a limiting factor for many aspects of the computing industry. Memory devices can easily throttle the overall performance of modern computing devices. To make memory faster, memory structures have been scaled down to miniscule sizes, dramatically increasing the density of the memory structures. Two-dimensional memory structures are starting to reach a theoretical limit with regard to the densities of the memory structures. The inventors have observed that three-dimensional memory structures may hold the key to further increasing memory densities. However, three-dimensional memory devices require significant changes in the structure and processing compared to two-dimensional memory devices.

Accordingly, the inventors have provided methods and structures for three-dimensional memory with scalable dimensions that allow memory densities beyond the capabilities of current technologies.

SUMMARY

Methods and apparatus for forming three-dimensional memory structures with scalable dimensions are provided herein.

In some embodiments, a method for forming a three-dimensional dynamic random-access memory (3D DRAM) structure may comprise depositing alternating layers of crystalline silicon (c-Si) material and crystalline silicon germanium (c-SiGe) material using an heteroepitaxy process onto a substrate and etching of a pattern of holes with at least one high aspect ratio (HAR) hole into the substrate, the pattern of holes configured to provide chemistry access to the alternating layers of c-Si material and c-SiGe material to laterally etch or deposit materials to form 3D DRAM features of the 3D DRAM structure without subsequent HAR etching of holes in the substrate to form the 3D DRAM features.

In some embodiments, the method may further include merging a portion of the pattern of holes formed by etching material between the portion of the pattern of holes to form an active area isolation slot of the 3D DRAM structure, depositing different materials in different holes to block or allow lateral or vertical recess process for 3D DRAM cell formation, forming an isolation slot which has a liner of a first dielectric material which is removable by exposure to hydrogen fluoride (HF) and which has ends filled with a second dielectric material impervious to HF, the isolation slot configured to provide lateral cell isolation and give structure support to the 3D DRAM structure, forming a lower electrode of a capacitor of the 3D DRAM structure that is supported at one or more ends of the isolation slot that are filled with the second dielectric material and removing the liner of the first dielectric material of the isolation slot to provide space to fill with a high-k top electrode material for increased 3D DRAM cell capacitance of the 3D DRAM structure while maintaining structural support of the lower electrode, etching the pattern of holes using a mask and etching process that etches both c-Si material and c-SiGe material, selectively etching the c-SiGe material from inside the at least one HAR hole to form a lateral feature extending from a sidewall of the at least one HAR hole, selectively etching the c-Si material in the at least one HAR hole to increase a size of the at least one HAR hole and a height of the lateral feature, and/or etching the c-Si material and the c-SiGe material in the at least one HAR hole to increase a size of the at least one HAR hole, a height of the lateral feature, and a width of the later feature that extends into the c-SiGe material.

In some embodiments, a method for forming a three-dimensional dynamic random-access memory (3D DRAM) structure may comprise depositing alternating layers of crystalline silicon (c-Si) material and crystalline silicon germanium (c-SiGe) material using an heteroepitaxy process on a substrate, etching of a pattern of holes with at least one high aspect ratio (HAR) hole into the substrate, the pattern of holes configured to provide chemistry access to the alternating layers of c-Si material and c-SiGe material to laterally etch or deposit materials to form 3D DRAM features of the 3D DRAM structure without subsequent HAR etching of holes in the substrate to form the 3D DRAM features, merging a portion of the pattern of holes formed by etching material between the portion of the pattern of holes to form slot features of the 3D DRAM structure, forming an isolation slot from at least one slot feature which has a liner of a first dielectric material which is removable by exposure to hydrogen fluoride (HF) and which has ends filled with a second dielectric material impervious to HF, the isolation slot configured to provide lateral cell isolation and give structure support to the 3D DRAM structure, forming a lower electrode of a capacitor of the 3D DRAM structure that is supported at one or more ends of the isolation slot that are filled with the second dielectric material, and removing the liner of the first dielectric material of the isolation slot to provide space to fill with a high-k top electrode material for increased 3D DRAM cell capacitance while maintaining structural support of the lower electrode.

In some embodiments, the method may further include etching a wordline hole between two isolation slots to form a wordline structure, selectively etching the c-SiGe material through a top opening of the wordline hole to form lateral wordline features extending to the two isolation slots, forming a source/drain and spacer of the 3D DRAM structure by extending the lateral wordline features until limited by the two isolation slots, depositing a conformal layer of doped oxide in the wordline hole, etching back the conformal layer of doped oxide to leave doped regions for a source/drain of the 3D DRAM structure, depositing a gate oxide layer in the wordline hole, and depositing a gate electrode to fill the wordline hole; anisotropically etching a slit between two wordline structures to form a bitline structure, selectively etching c-SiGe material laterally in the slit from a top opening of the slit, forming the bitline structure by chemically depositing and etching from the top opening of the slit, and forming a conductive shield layer in the bitline structure to reduce noise coupling between multiple bitlines; etching the pattern of holes using a mask and etching process that etches both c-Si material and c-SiGe material; selectively etching the c-SiGe material from inside the at least one HAR hole to form a lateral feature extending a sidewall of the at least one HAR hole; selectively etching the c-Si material in the at least one HAR hole to increase a size of the at least one HAR hole and a height of the lateral feature or etching the c-Si material and the c-SiGe material in the at least one HAR hole to increase a size of the at least one HAR hole, a height of the lateral feature, and a width of the later feature that extends into the c-SiGe material; and/or depositing different materials in different holes to block or allow lateral or vertical recess process for 3D DRAM cell formation.

In some embodiments, a structure for use in three-dimensional dynamic random-access memory (3D DRAM) may comprise at least one vertical wordline feature of the 3D DRAM formed via a high aspect ratio (HAR) central hole in a stack of alternating layers of crystalline silicon (c-Si) and crystalline silicon germanium (c-SiGe) and at least one horizontal bitline feature of the 3D DRAM adjacent perpendicular to the at least one vertical wordline feature of the 3D DRAM.

In some embodiments, the structure may further include wherein the at least one vertical wordline feature of the 3D DRAM has at least one gate all-around (GAA) transistor structure, wherein the at least one GAA transistor structure has lateral source/drain doping areas and spacers that are symmetrical to the HAR central hole and self-aligned, wherein the at least one horizontal bitline feature of the 3D DRAM has a shield configured to reduce noise coupling formed over the at least one horizontal bitline feature, and/or wherein the at least one vertical wordline feature of the 3D DRAM is positioned between two isolation features that are configured to provide structural support for the 3D DRAM.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

FIG. 5 depicts a top-down view and a cross-sectional view of slot formation by hole versus slot formation by slot etching in accordance with some embodiments of the present principles.

FIG. 6 depicts a slot formation process using holes in accordance with some embodiments of the present principles.

FIG. 10 depicts a top-down view of isolation feature holes after some holes are enlarged in accordance with some embodiments of the present principles.

FIG. 11 depicts a top-down view of isolation feature holes after deposition of a dielectric material into the holes in accordance with some embodiments of the present principles.

FIG. 12 depicts a top-down view of a wordline feature hole after deposition and resist removal processes in accordance with some embodiments of the present principles.

Figure 1:
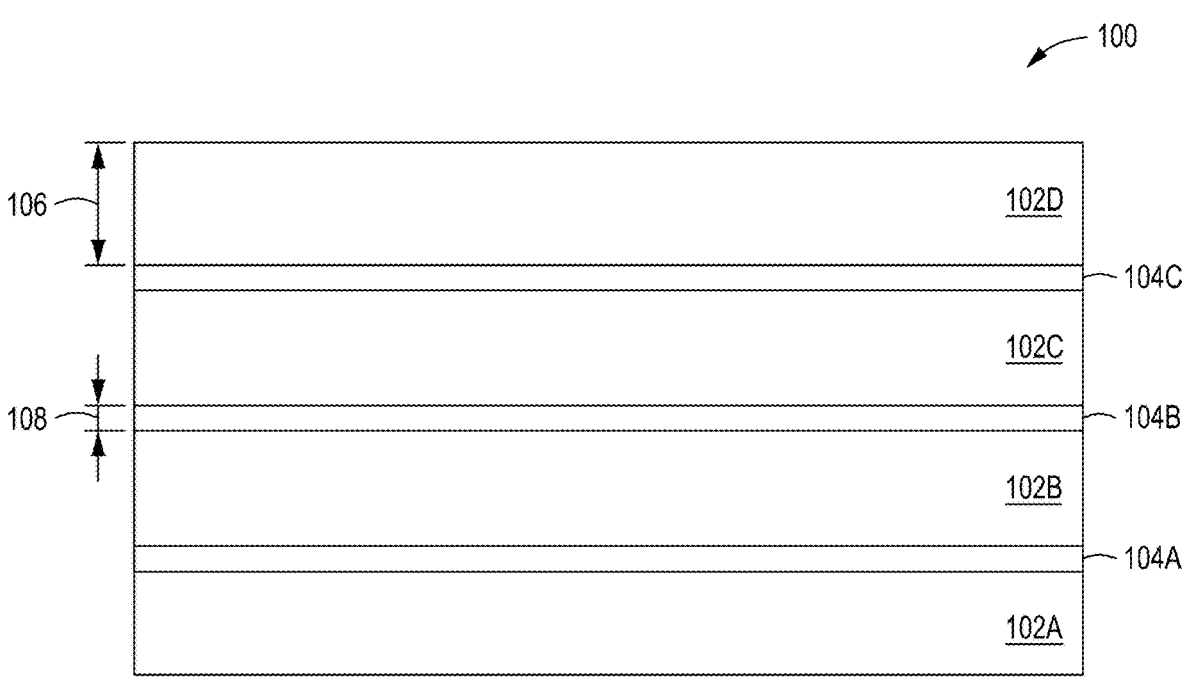
FIG. 1 depicts a cross-sectional view of alternating heteroepitaxial layers of silicon and silicon germanium in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and structures enable three-dimensional (3D) dynamic random-access memory (DRAM) cells that use economical materials and process methods to produce memory arrays which can meet a D1d memory density of approximately 1300 um$^2$ per megabit and beyond. Two-dimensional (2D) DRAM scaling is becoming very difficult to manufacture, and the cost is constantly increasing. Below the D1d DRAM node, the feature size will be so small that even self-aligned quadruple patterning (SAQP) will no longer be a viable option. Even if extreme ultraviolet (EUV) lithography is adopted, the EUV lithography will still need to be at least self-aligned double patterning (SADP), if not SAQP at most levels. Although 3D DRAM is a concept that has been investigated widely in the DRAM industry for D1d and beyond, proposed solutions cannot be processed with economical materials and processes at the dimensions needed to reach memory density comparable to 2D DRAM.

The methods and structures of the present principles use a gate all-around (GAA) transistor that incorporates crystalline silicon (c-Si) and crystalline silicon germanium (c-SiGe) in alternating heteroepitaxy grown layers to form a structure for 3D DRAM. As depicted in a cross-sectional view 100 of FIG. 1, a first c-Si layer 102A is formed followed by a first c-SiGe layer 104A. The process is repeated with a second c-Si layer 102B followed by a second c-SiGe layer 104B. Likewise, a third c-Si layer 102C is then formed followed by a third c-SiGe layer and a fourth c-Si layer 102D. The layers continue to alternate to form as many layers as needed for a particular structure or structures, allowing tremendous flexibility for memory structure design. In some embodiments, a c-Si layer may have a thickness 106 of approximately 40 nm to approximately 60 nm and a c-SiGe layer may have a thickness 108 of approximately 5 nm to approximately 20 nm. In some embodiments, a c-Si layer may have a thickness 106 of approximately 50 nm and a c-SiGe layer may have a thickness 108 of approximately 10 nm. The thicknesses may vary based upon the design of a given memory structure. By using an alternating heteroepitaxy of silicon and silicon germanium, many layers of memory cells may be easily constructed with high cost-efficiency.

Figure 2:
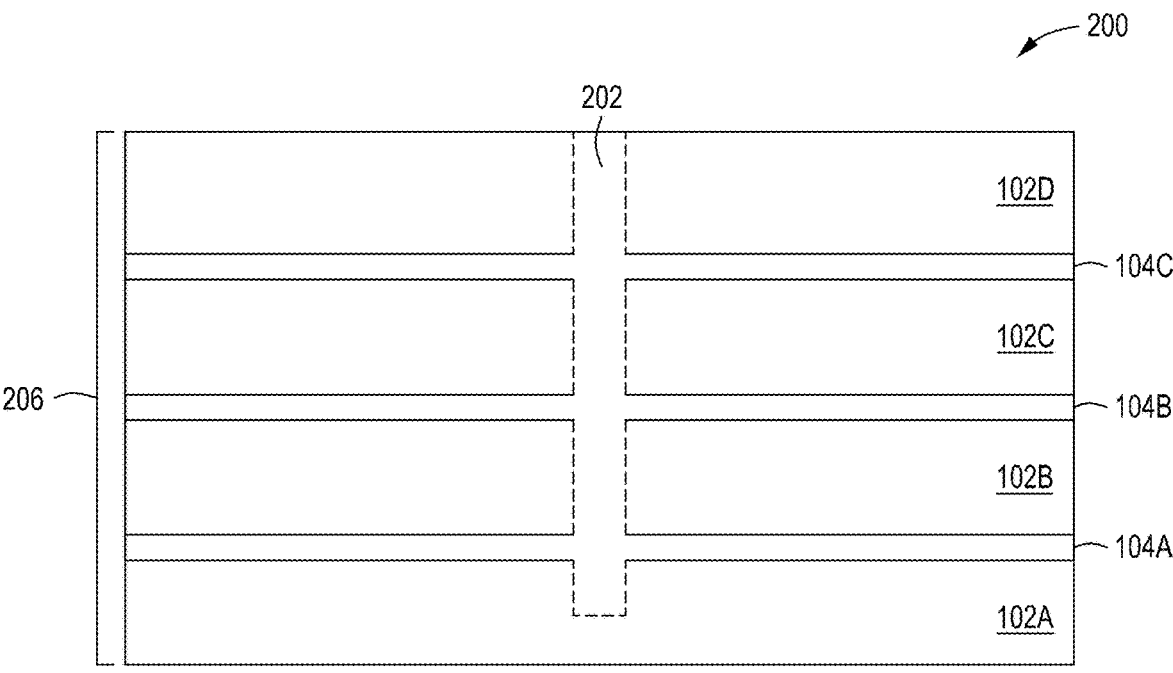
FIG. 2 depicts a cross-sectional view of a HAR hole formation for a feature in accordance with some embodiments of the present principles
Figure 3:
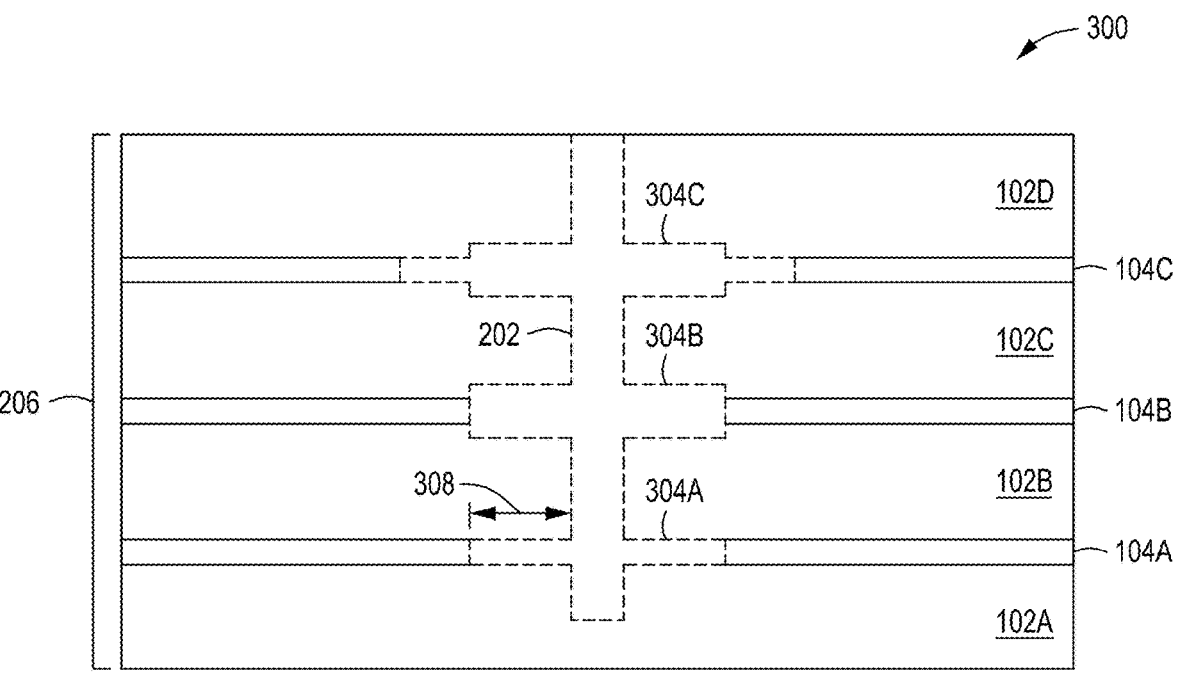
FIG. 3 depicts a cross-sectional view of a silicon/silicon germanium stack with features in accordance with some embodiments of the present principles.

In the cross-sectional view 200 of FIG. 2, the start of the formation of a memory structure feature is depicted. In some memory structures, a high aspect ratio (HAR) hole 202 may be formed into the Si/SiGe stack 206. The HAR hole 202 may be formed into vertical wordlines, horizontal bitlines, capacitors, and the like. The HAR hole 202 may be formed, for example, by using a mask and etching process that etches both the c-Si and c-SiGe. In the cross-sectional view 300 of FIG. 3, the HAR hole 202 is further processed to form various lateral features from within the HAR hole 202. The features shown are merely examples of how the Si/SiGe stack 206 may be used in the formation of 3D DRAM features. The examples are not meant to be limiting in any fashion. A first feature 304A may be formed by using a selective removal process (SRP) to selectively remove only the SiGe. By adjusting the selective removal process, the amount 308 of lateral etching may be precisely controlled. A second feature 304B may be formed by using an etch process to etch the Si to increase the size of the second feature 304B. The etch process used may be selective to Si or may etch both Si and SiGe depending on the desired size or shape of the feature. A third feature 304C may be formed using an SRP to selectively remove additional lateral portions of the SiGe layer 104C. By using selective and non-selective etching processes along with the Si/SiGe stack 206, many different types of features may be easily and economically formed in the Si/SiGe stack 206.

Figure 4:
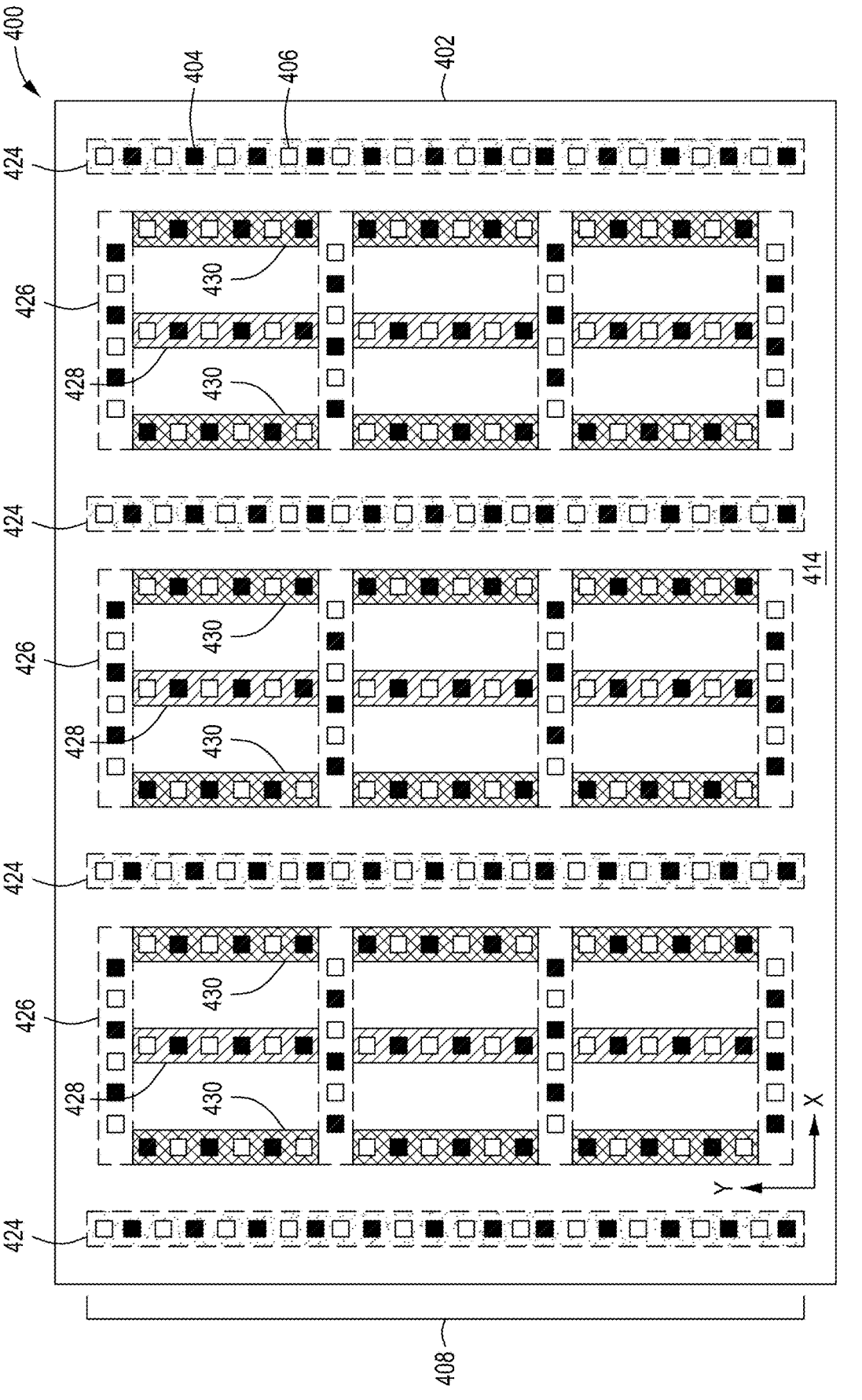
FIG. 4 depicts a top-down view of an example 3D DRAM layout in accordance with some embodiments of the present principles.

In FIG. 4, a top-down view 400 depicts an example layout 408 for forming 3D DRAM memory features in an Si/SiGe stack 402. Etching processes may be used to open different holes or different sets of holes depending on the type of features desired in the Si/SiGe stack 402 to be formed at a given point in a formation process. In some embodiments, first hole positions 404 may be defined and etched into the top dielectric anti-reflective coating (DARC) layer 414 using a first argon fluoride (ArF) exposure mask followed by second hole positions 406 to allow a smaller hole pitch than could be directly printed with ArF lithography. In some embodiments, the features can be holes or short slots and are used to define the active area, wordline, capacitor, and bitline regions. In some embodiments, most or all of the holes can go through the deep (HAR) etching at the same time, and then selected regions (e.g., first areas 424, second areas 426, third areas 428, and/or fourth areas 430) may be filled or covered with resist to prevent processing of holes within the selected regions to sequentially define the active areas, wordlines, capacitors, and bitlines. Subsequent processes may remove the resist from the second hole positions 406 and allow the second hole positions 406 to be deep etched at a later time, allowing a great amount of flexibility in 3D DRAM layout. The methods and structures of the present principles permit the layout and main structure deep etching to be performed first without requiring the deep etching to be interspersed in the structure formation processes, reducing processing time and costs.

As discussed below, hole pattern etching is used to form the basic structure of many different types of features including slots. Although, the example layout shown in the top-down view 400 uses an alternating photolithographic pattern, one skilled in the art will understand that all hole positions may also be printed at the same time. The alternating patterning of holes allows less expensive lithography processes. The printing of different purposed holes at once or a grid of holes eliminates error in alignment of the combined purposed holes. The pre-formed holes may be opened or closed at any point of the processing to form slits or slots or to increase a dimension in any direction (e.g., the X or Y direction) or to allow local selective etching of the SiGe layer. In FIG. 4, the top-down view 400 also depicts 3D DRAM memory regions for active area, wordline, capacitor, and bitline formation formed in the Si/SiGe stack 402 for some embodiments. First areas 424 of the Si/SiGe stack 402 include vertical wordlines. Second areas 426 of the Si/SiGe stack 402 include active areas. Third areas 428 of the Si/SiGe stack 402 include capacitor areas. Fourth areas 430 of the Si/SiGe stack 402 include horizontal bitlines. By using different sets of holes as described above, the hole sets can be opened and processed at different times to form the active area slots, the capacitor slits, the wordline slits, and/or the bitline slits and the like.

Formation of slots or slits from the deep etched holes provides a building block for 3D DRAM feature construction. In FIG. 5, a top-down view 500A and a cross-sectional view 500B depict slot formation by hole versus slot formation by slot etching. A hole 504 etched into a substrate 502 has a relatively consistent diameter 516 throughout the length 522 of the hole 504 with straight sidewalls 506. In contrast, when a slot 508 is formed by etching, the opening dimensions (opening width 534 and opening length 532) at the surface of the substrate are not consistent throughout the depth 520 of the slot 508. The sidewalls 510 of the slot 508 are irregular and the opening width 534 tends to increase to an inside width 512 while the opening length 532 tends to decrease to an inside length 514 due to etching irregularities. The inventors have found that forming a slot using holes provides a slot with increased dimensional accuracy throughout the depth of the slot. In FIG. 6, a process of forming a slot 610 using hole etching is depicted. In a first process 600A, a series of holes 620 are etched into a substrate and spaced in close proximity. For example, in some embodiments, the hole diameter 622A may be approximately 30 nm with a hole edge to hole edge spacing 624 of approximately 20 nm. In a second process 600B, the series of holes 620 are each enlarged. For example, in some embodiments, the increased hole diameter 622B may be approximately 50 nm. In a third process 600C, the diameters of the holes are increased such that a slot 610 is formed into the substrate.

Figure 7:
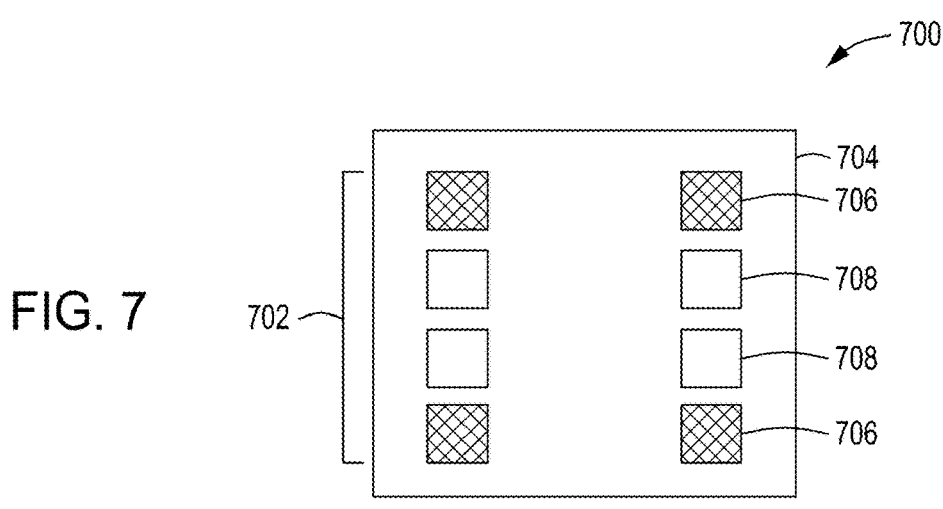
FIG. 7 depicts a top-down view of isolation feature holes in accordance with some embodiments of the present principles.
Figure 8:
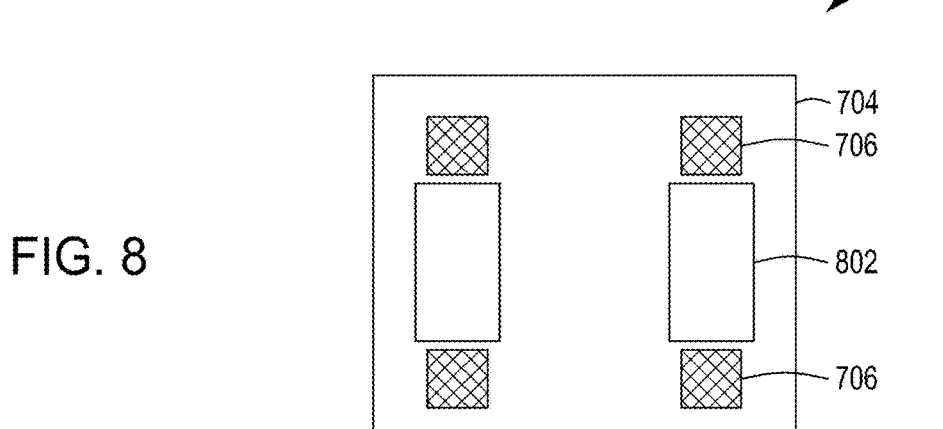
FIG. 8 depicts a top-down view of isolation feature holes after a slot is formed in accordance with some embodiments of the present principles.
Figure 9:
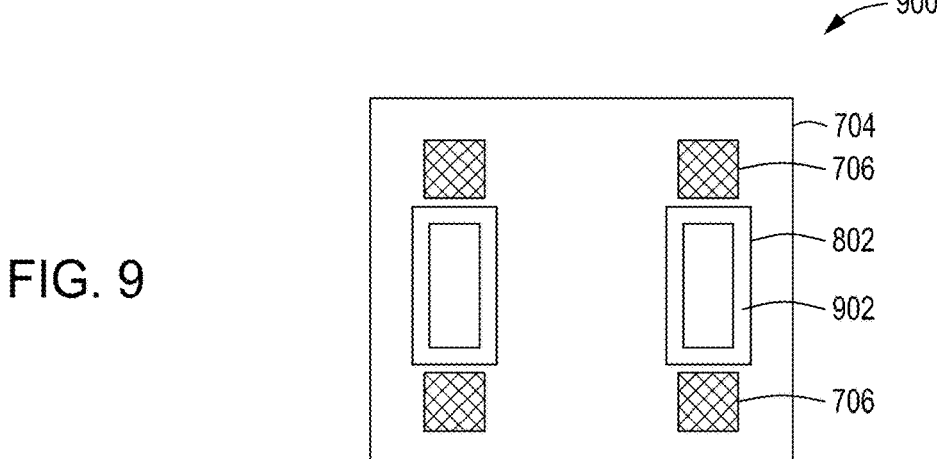
FIG. 9 depicts a top-down view of isolation feature holes after a low temperature oxide layer is formed in the slot in accordance with some embodiments of the present principles.
Figures 39, 40:
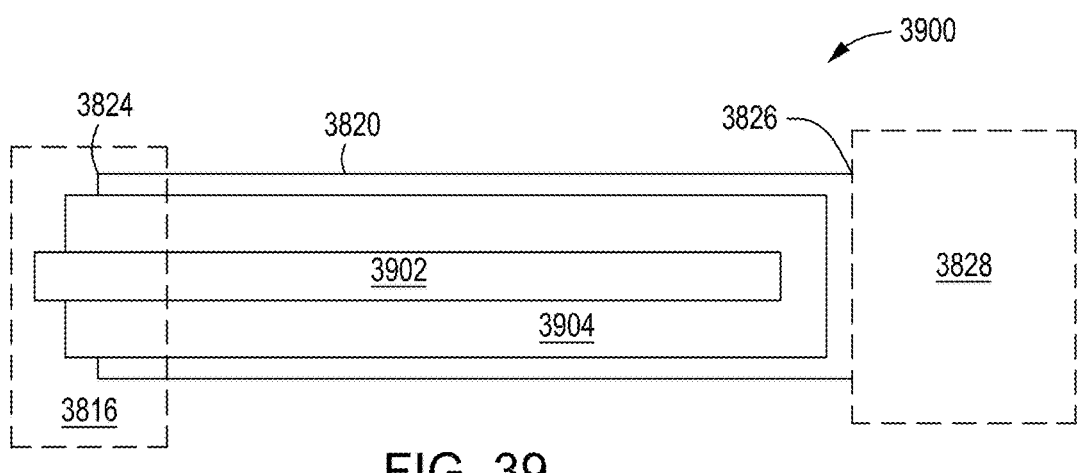
FIG. 39 depicts a cross-sectional view of a capacitor structure with a lower electrode in accordance with some embodiments of the present principles.
FIG. 40 depicts a cross-sectional view of a 3D DRAM structure in accordance with some embodiments of the present principles.
Figure 41:
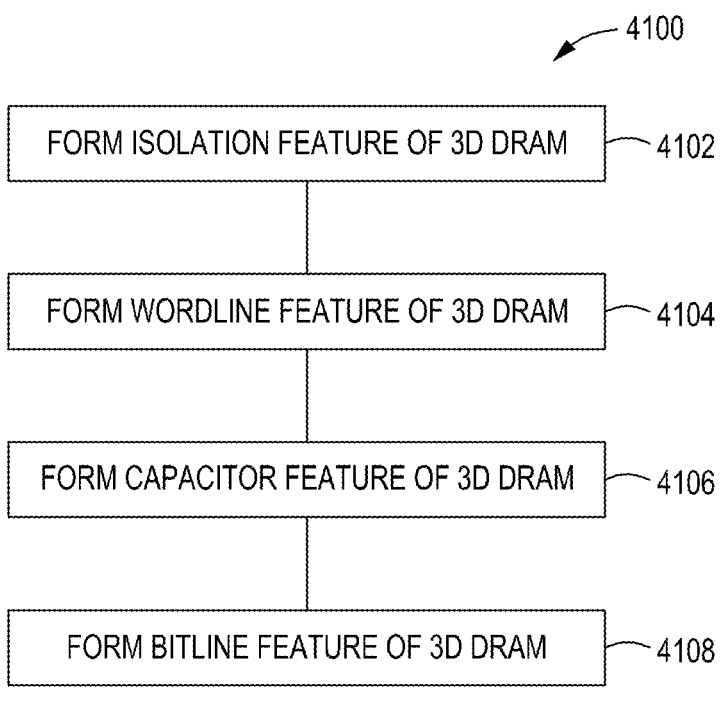
FIG. 41 is a method for forming 3D DRAM structures in accordance with some embodiments of the present principles.

FIG. 41 is a method 4100 of forming a vertical wordline feature 4002 of a 3D DRAM using an alternating c-Si and c-SiGe heteroepitaxial stack 4008 (as depicted in a cross-sectional view 4000 of FIG. 40). Reference to FIGS. 1-24, 40, and 42-44 may be made during the description of the method 4100. In block 4102, an isolation feature 1102 is formed in a Si/SiGe stack 704 as depicted in a top-down view 1100 of FIG. 11. The isolation feature 1102 starts as a series of etched holes 702 as depicted in a top-down view 700 of FIG. 7. Outer holes 706 are filled/blocked with resist. The middle holes 708 are further etched to increase the dimensions of the middle holes 708 until the middle holes 708 join to make a slot 802 as depicted in a top-down view 800 of FIG. 8. The slot 802 is then conformally coated with a low temperature oxide layer 902 (e.g., but not limited to, silicon dioxide and the like) as depicted in a top-down view 900 of FIG. 9. Resist is then removed from the outer holes 706, and the outer holes 706 are then enlarged by etching until contact is made with the low temperature oxide layer 902 as depicted in a top-down view 1000 of FIG. 10 which then completes the formation of an isolation slot.

The enlarged outer holes 706A and the slot 802 are then filled with a dielectric 1104 (e.g., but not limited to, nitride and the like) as depicted in FIG. 11. The dielectric 1104 provides a skeletal backbone to support other features within the 3D DRAM. The dielectric 1104 also provides an etch stop during subsequent lateral etching to form various features of the 3D DRAM. In some embodiments, the dielectric 1104 is selected from a material that allows selective removal of silicon and/or silicon germanium without removal of the dielectric 1104. In some circumstances, such as during the formation of a capacitor for the 3D DRAM, the low temperature oxide layer 902 may be selectively removed (discussed below) after formation of the isolation feature 1102. In some embodiments, the overall isolation slot has a central portion of the length of the slot which has a silicon dioxide liner that allows a vertical path to connect with a subsequently formed wordline feature when hydrogen fluoride (HF) etching is used, but ends of the isolation slot are filled with a dielectric such as nitride which does not etch in HF to keep lateral cell isolation and structural support.

Figure 24:
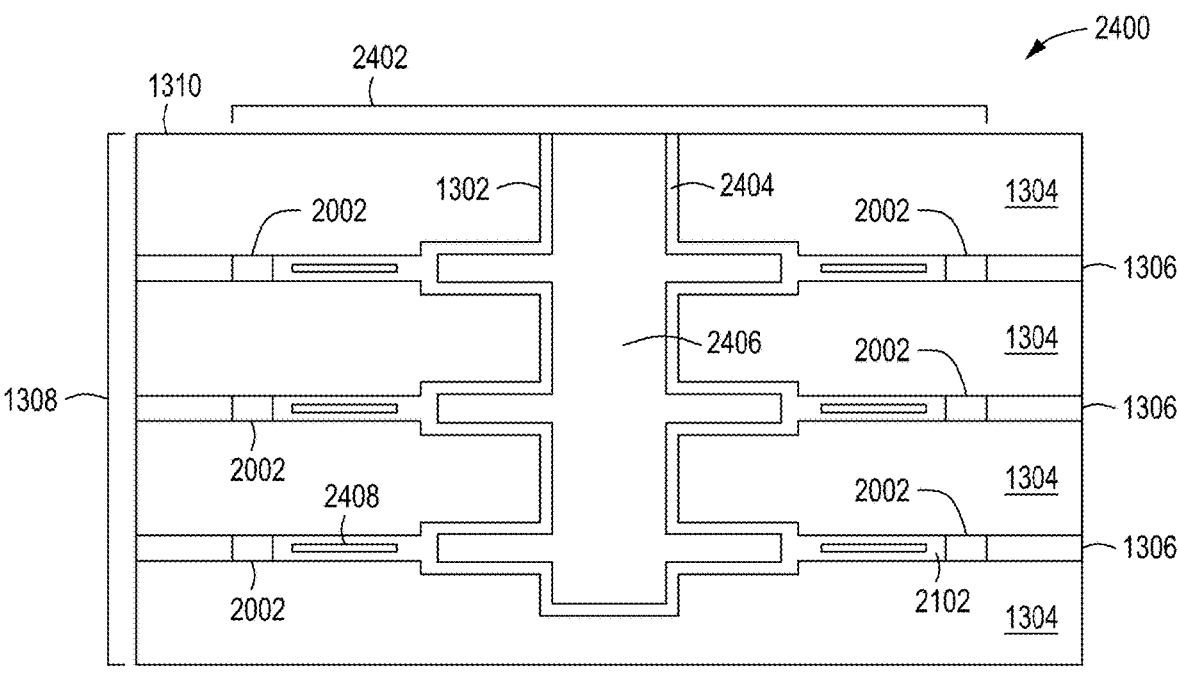
FIG. 24 depicts a cross-sectional view of depositing gate oxide and gate electrode materials in accordance with some embodiments of the present principles.

In block 4104 of FIG. 41, a feature for the vertical wordline feature 4002 is formed such as a GAA transistor feature 2402 as depicted in the cross-sectional view 2400 of FIG. 24. In an example formation of the wordline feature, a wordline hole 1202 positioned between two isolation features as depicted in a top-down view 1200 of FIG. 12 is processed. Although not illustrated in prior figures for the sake of brevity, the wordline hole 1202 could have been etched at a similar time as the isolation feature holes and covered with resist to protect the wordline hole 1202. The resist and any deposition material is removed and the wordline hole 1202 is opened to allow access for lateral etching chemistry from the top of the substrate. The cross-section line 1204 indicates the cut line for the views in FIGS. 13, 15, 16, and 18-24. The following transistor formation is self-aligned, providing low leakage and high drive current capabilities. A self-aligned source/drain doping is also accomplished from the vertical wordline channel formation using, in some embodiments, a thin phosphosilicate glass (PSG) fill process and removal to form a plug of PSG to dope the silicon material. A self-aligned dielectric spacer (e.g., but not limited to, a nitride spacer) formation is also achieved using a thin dielectric to fill a previously formed SiGe gap to form a plug of dielectric.

Figure 13:
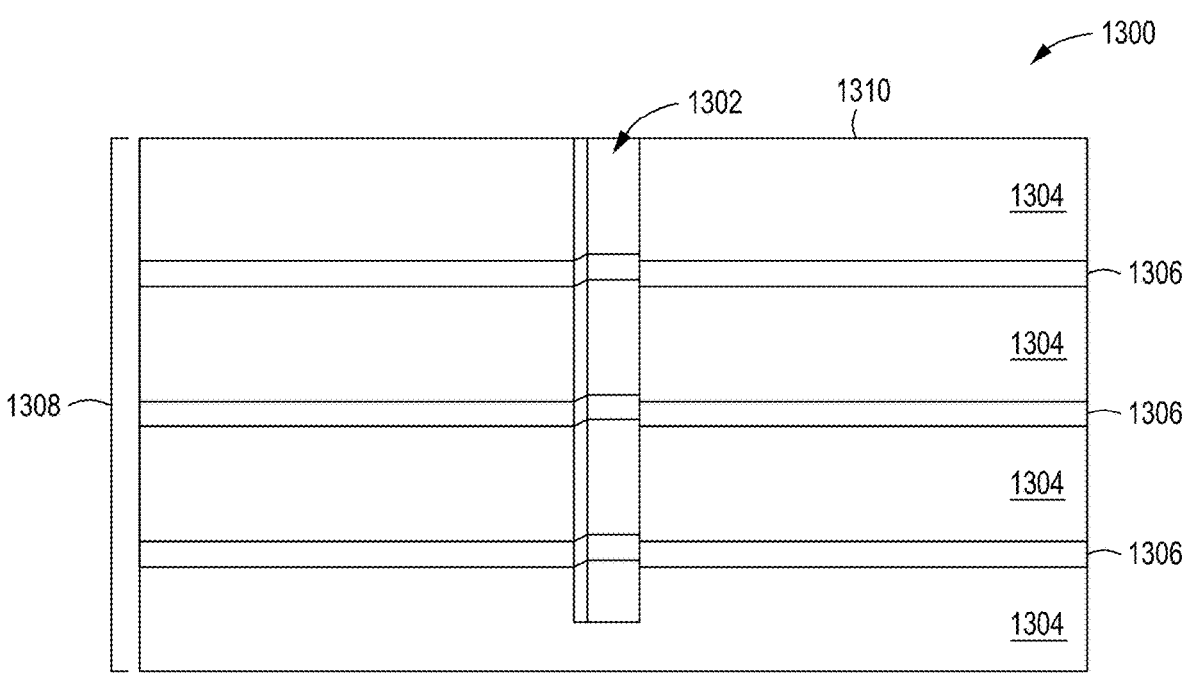
FIG. 13 depicts a cross-section view of a wordline feature hole in a silicon/silicon germanium stack in accordance with some embodiments of the present principles.
Figure 14:
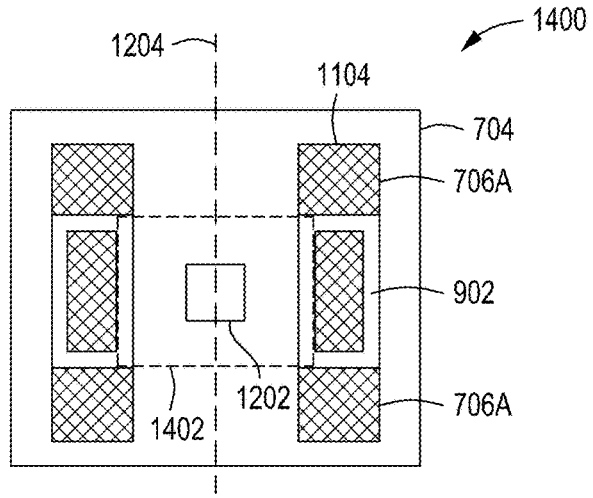
FIG. 14 depicts a top-down view of a first lateral etching area of a silicon/silicon germanium stack in accordance with some embodiments of the present principles.
Figure 15:
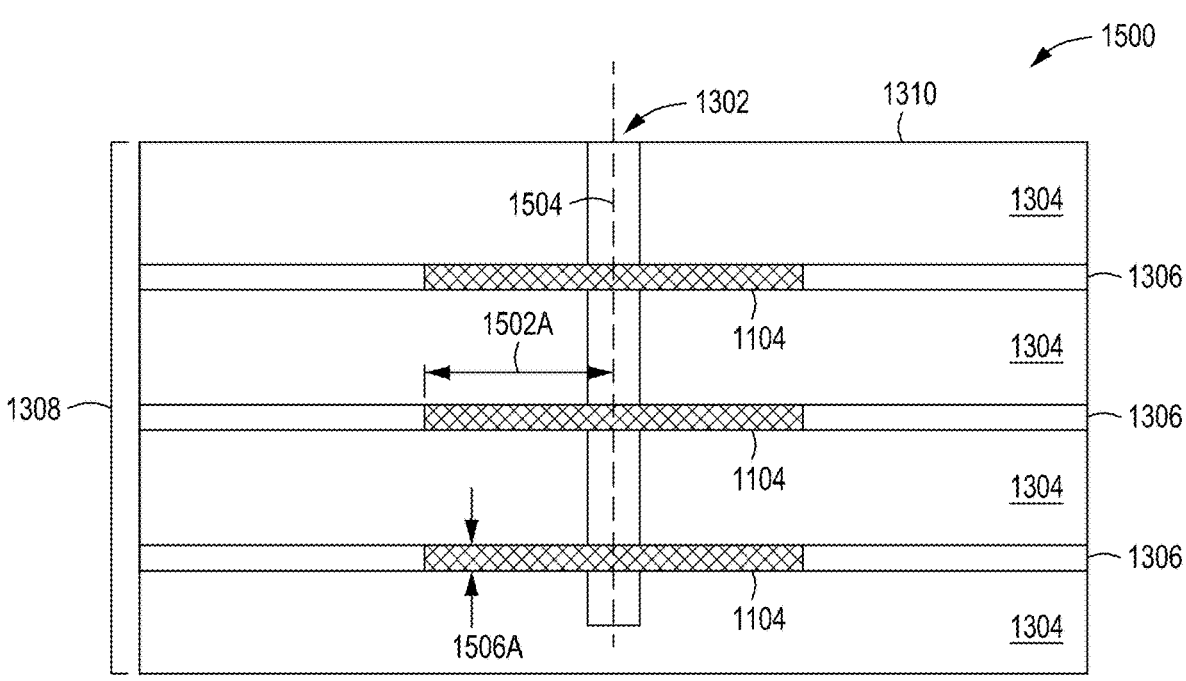
FIG. 15 depicts a cross-sectional view of a lateral selective etch of the silicone germanium layers in accordance with some embodiments of the present principles.
Figure 16:
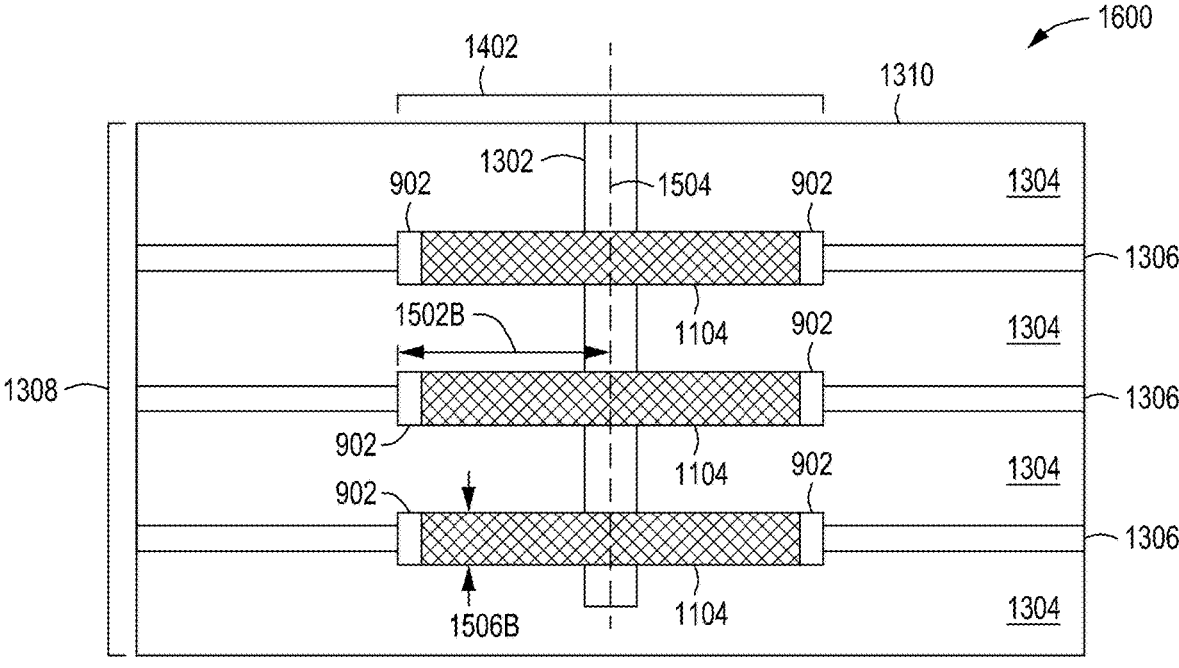
FIG. 16 depicts a cross-sectional view of an etching process to increase an etched gap size in accordance with some embodiments of the present principles.
Figure 17:
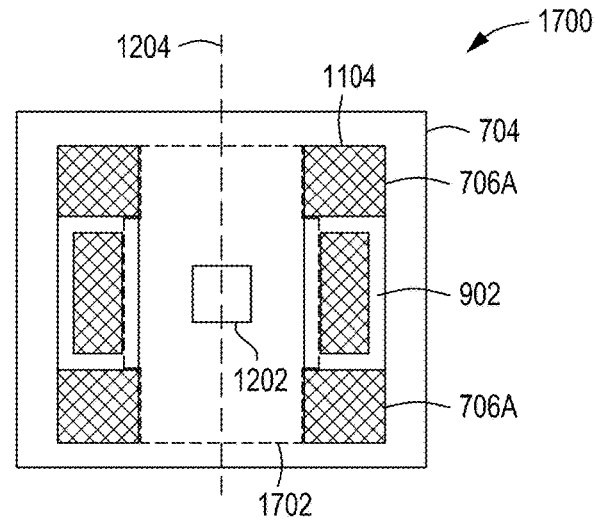
FIG. 17 depicts a top-down view of forming source/drain and spacer regions of a transistor in accordance with some embodiments of the present principles.
Figure 18:
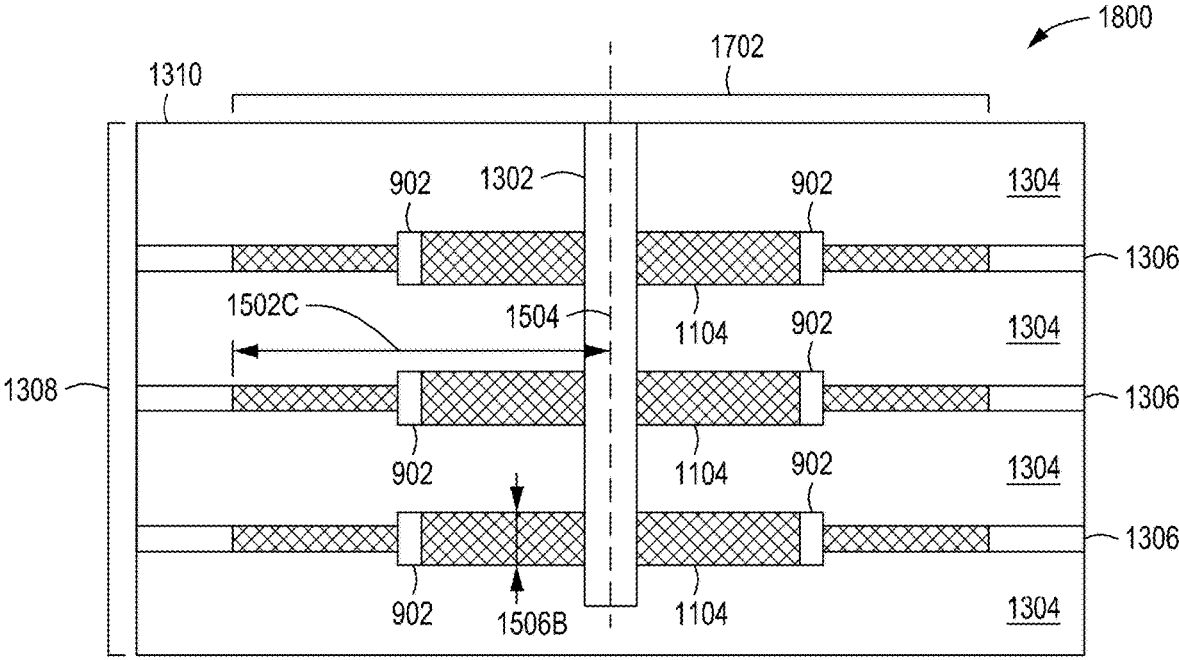
FIG. 18 depicts a cross-sectional view of selectively etching silicon germanium layers in accordance with some embodiments of the present principles.

In a cross-sectional view 1300 of FIG. 13, a wordline feature hole 1302 is formed into a Si/SiGe stack 1308 made of alternating Si layers 1304 and SiGe layers 1306. The wordline feature hole 1302 allows chemistry access into the Si/SiGe stack 1308 from a top surface 1310 of the Si/SiGe stack 1308. In a top-down view 1400 of FIG. 14, a first lateral etching area 1402 is depicted inside of the Si/SiGe stack 1308. In FIG. 15, a cross-sectional view 1500 depicts a lateral selective etch of the SiGe layers 1306. The etchant is selective to SiGe over silicon and the dielectric 1104 which acts as an etch stop. The etch distance 1502A from a centerline 1504 of the wordline feature hole 1302 can be controlled by the etch rate of the etchant and/or the duration of the etching process. The etched gap has a height 1506A that follows the thickness of the SiGe layers 1306 due to the selective etchant used. An etching process is then performed to remove both Si and SiGe to increase the etched gap as depicted in a cross-sectional view 1600 of FIG. 16. The etched gap is increased in height 1506B and also in length to an increased etch distance 1502B. As can be seen in the top-down view 1400 of FIG. 14, the first lateral etching area 1402 extends to the dielectric 1104 and also into the low temperature oxide layer 902. The Si and SiGe etching exposes the dielectric 1104 and the low temperature oxide layer 902 when the first lateral etching area 1402 is fully formed as shown in the top-down view 1400. During the prior etching sequences, the gate all-around space for the gate oxide is created as discussed below for FIG. 44. The process continues by forming a second lateral etching area 1702 to form the source/drain and spacer regions of the transistor as depicted in a top-down view 1700 of FIG. 17. The second lateral etching area 1702 extends the first lateral etching area 1402. The second lateral etching area 1702 is formed by selectively etching the SiGe layers 1306 to increase the etching distance 1502C as depicted in a cross-sectional view 1800 of FIG. 18.

Figure 19:
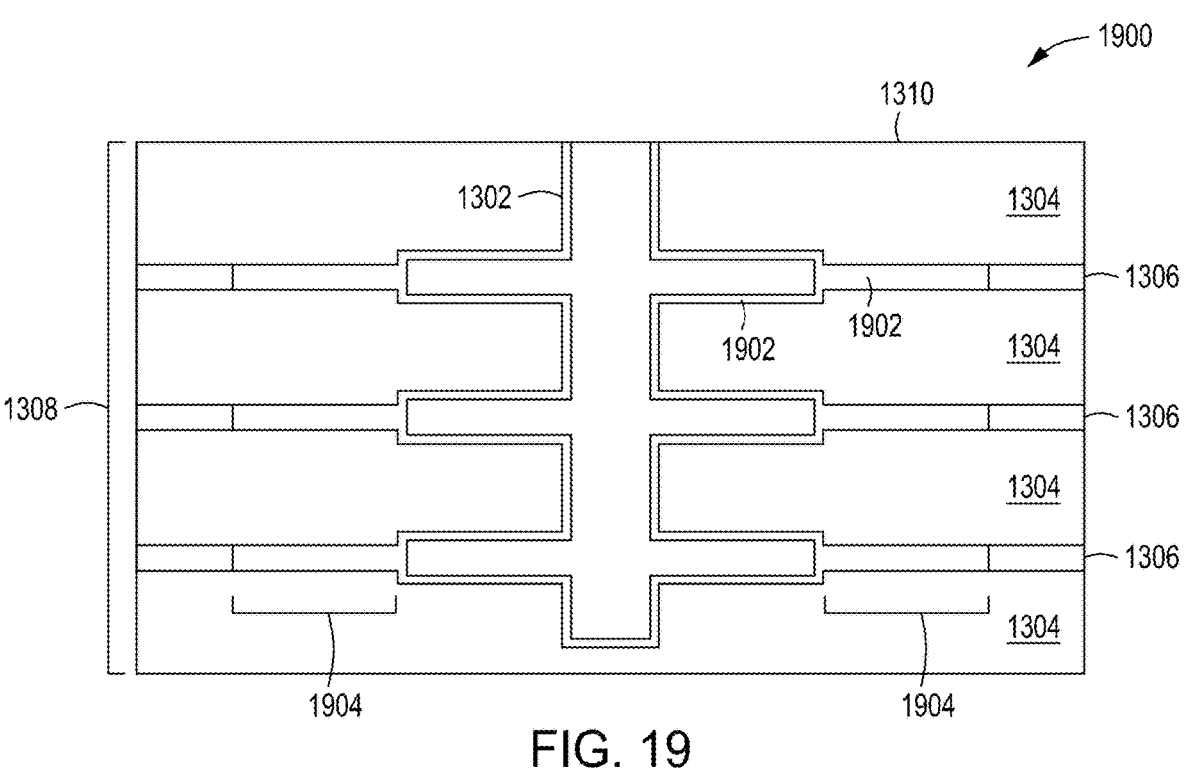
FIG. 19 depicts a cross-sectional view of conformally coating a wordline feature hole with doped oxide in accordance with some embodiments of the present principles.
Figure 20:
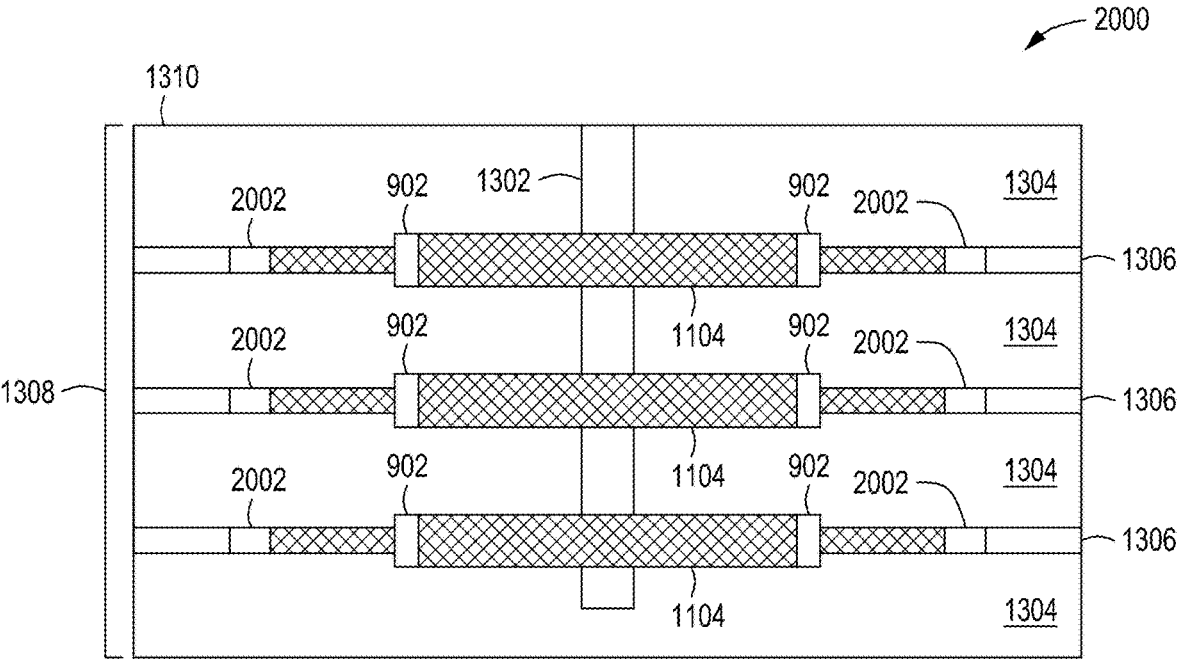
FIG. 20 depicts a cross-sectional view of etching back a conformal coating in a wordline feature hole to form doped regions of a transistor in accordance with some embodiments of the present principles.
Figure 21:
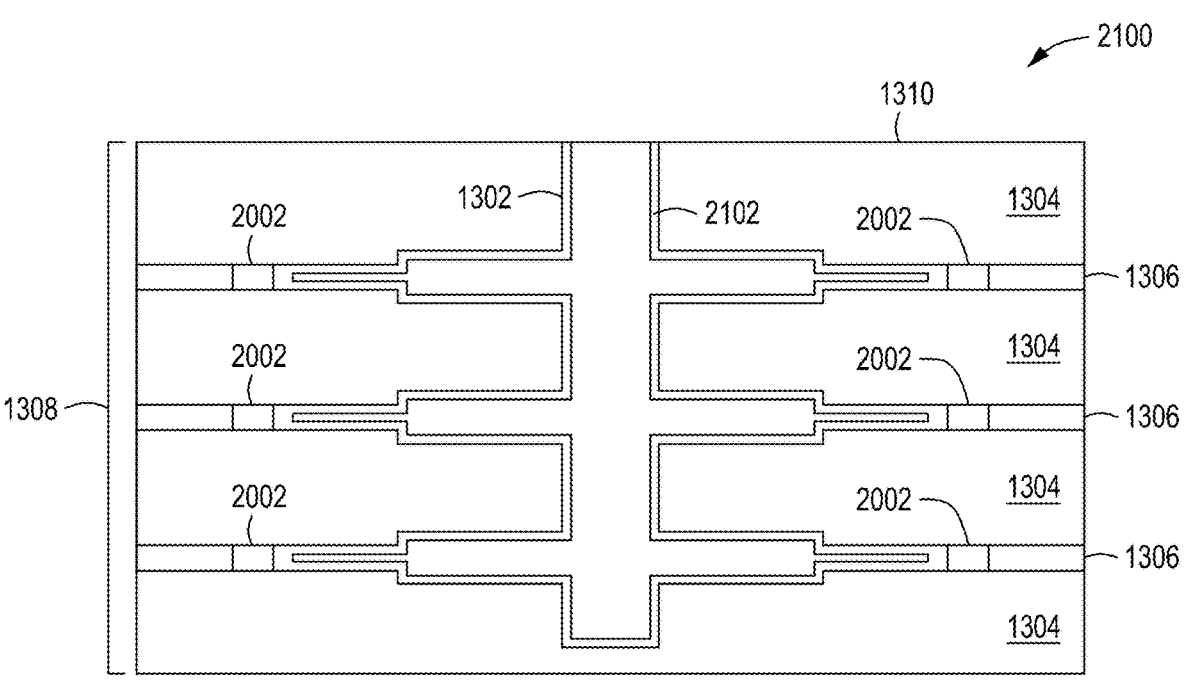
FIG. 21 depicts a cross-sectional view of an oxide layer deposited in a wordline feature hole in accordance with some embodiments of the present principles.
Figure 22:
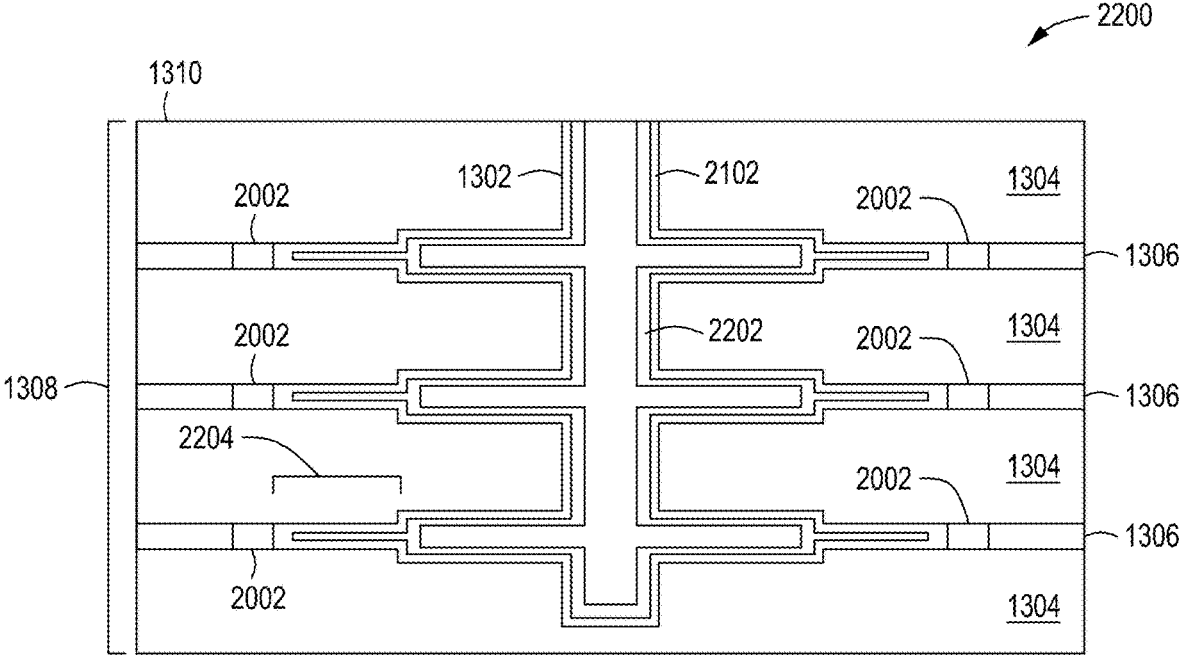
FIG. 22 depicts a cross-sectional view of a dielectric layer deposited in a wordline feature hole in accordance with some embodiments of the present principles.
Figure 23:
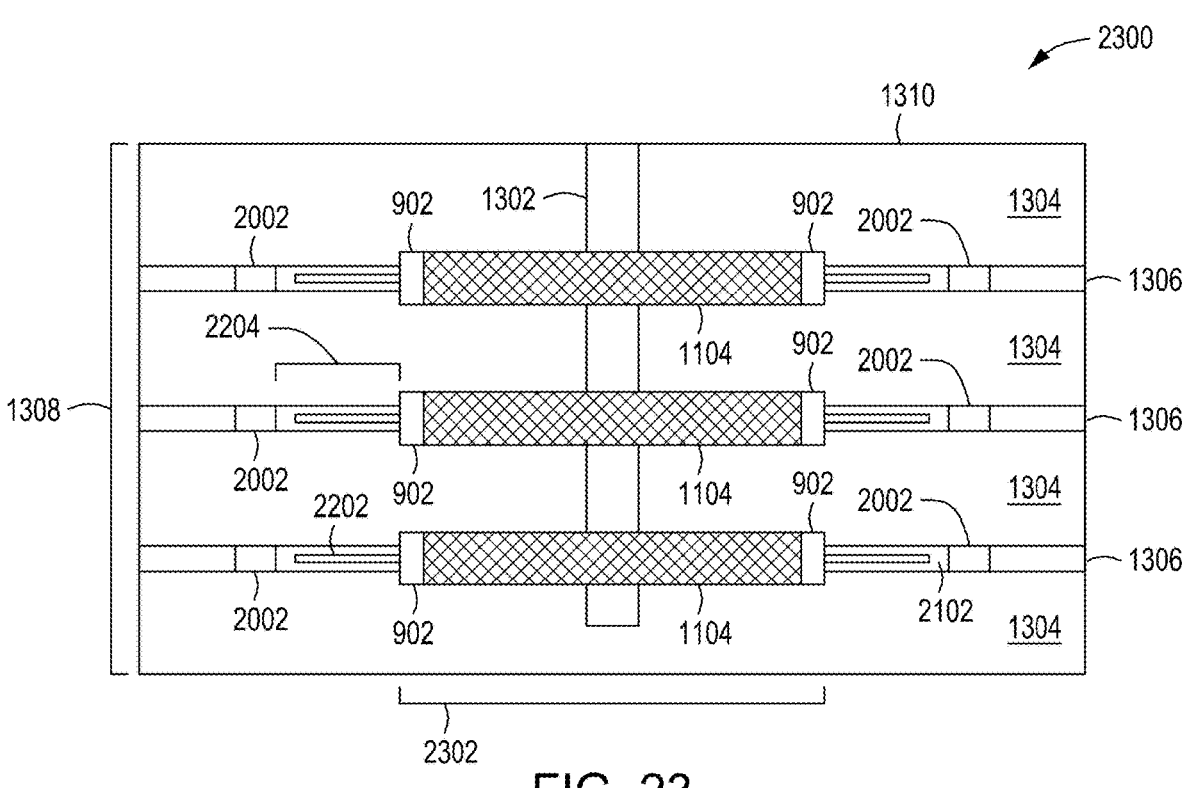
FIG. 23 depicts a cross-sectional view of removal of a portion of a dielectric layer and an oxide layer in accordance with some embodiments of the present principles.

A conformal layer 1902 of doped oxide such as, but not limited to, PSG is deposited into the wordline feature hole 1302 as depicted in a cross-sectional view 1900 of FIG. 19. An ALD or CVD deposition process may be used dependent on the dimensions (ALD preferred for smaller dimensions). The conformal layer 1902 lines the wordline feature hole 1302 and completely fills the narrow portion 1904 of the lateral gaps. The conformal layer 1902 is then etched back leaving doped regions 2002 as depicted in a cross-sectional view 2000 of FIG. 20. A thin oxide layer 2102 is then deposited or grown with the wordline feature hole 1302 as depicted in a cross-sectional view 2100 of FIG. 21. The oxide can be formed on the silicon surface (e.g., thermal oxide) or deposited on the silicon. A dielectric layer 2202 such as, but not limited to, nitride and the like is then conformally deposited in the wordline feature hole 1302 to fill the narrow portions 2204 of the gaps as depicted in a cross-sectional view 2200 of FIG. 22. The dielectric layer 2202 is then removed with oxide to protect the silicon in the large portion 2302 of the gap. The thin oxide layer 2102 is then removed, leaving a portion of the dielectric layer 2202 and the thin oxide layer 2102 in the narrow portion 1904 of the gap as depicted in a cross-sectional view 2300 of FIG. 23. A gate oxide layer 2404 is grown or deposited using an ALD deposition process in the wordline feature hole 1302 as depicted in a cross-sectional view 2400 of FIG. 24. The source/drain doping regions 2002 and newly formed spacers 2408 are symmetrically formed within the Si/SiGe stack 1308. A gate electrode 2406 is then deposited into the wordline feature hole 1302 using an ALD process until the wordline feature hole 1302 is filled. The gate electrode 2406 may be, but not limited to, titanium nitride (TiN) and the like.

Figure 38:
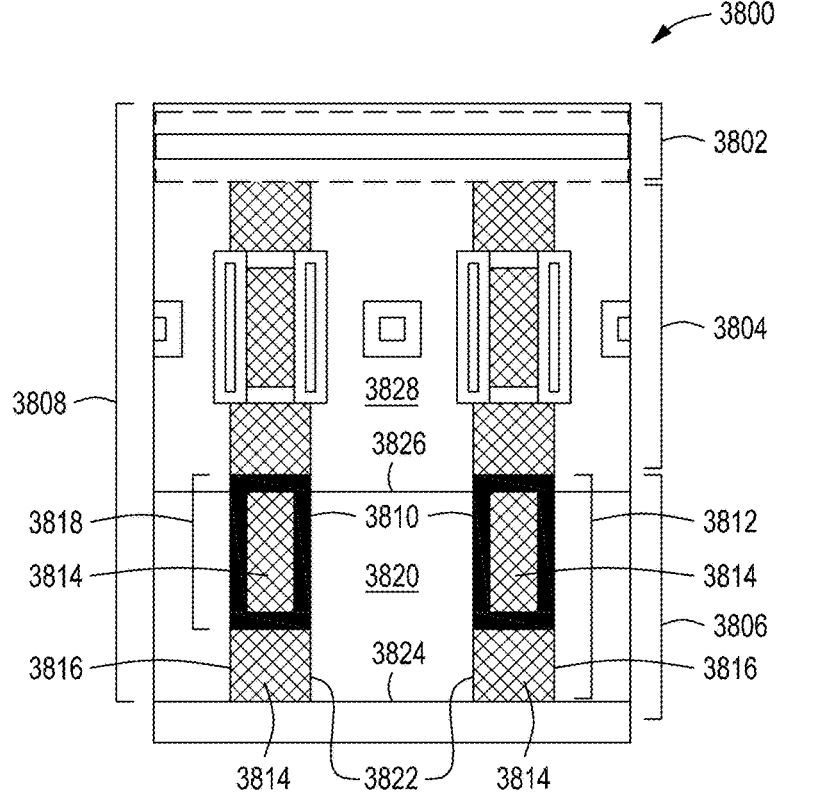
FIG. 38 depicts a top-down view of a horizontal bitline structure interfacing with a vertical word line structure which interfaces with a capacitor structure forming a 3D DRAM structure in accordance with some embodiments of the present principles.

Referring back to FIG. 41, in block 4106, a capacitor feature is formed for the 3D DRAM. Reference to FIGS. 38 and 40 will be made to illustrate the formation of the capacitor feature 4006 of FIG. 40 of the 3D DRAM. In some embodiments, the capacitor feature is a support structure for a lower electrode of a capacitor. A top-down view 3800 of FIG. 38 depicts a horizontal bitline structure 3802 interfacing with a vertical wordline structure 3804 which interfaces with a capacitor structure 3806, forming a 3D DRAM structure 3808. As the formation of the isolation slots with a different dielectric around the wordline features are made, so is a support structure 3812 formed for the capacitor structure 3806. In brief, a slot structure 3818 is coated in a dielectric material, such as a low temperature oxide, and the ends of a slot structure 3818 (support columns 3816) are filled with a second dielectric material 3814, such as a nitride, that functions as a structural support. The first dielectric material (not shown) is then removed using a selective etching process such as, but not limited to using hydrogen fluoride (HF) to etch $SiO_2$ material, which leaves voids 3810 surrounding the second dielectric material 3814, separating the lower electrode 3820 from the second dielectric material 3814. A second end 3826 of the lower electrode 3820 is then supported by silicon 3828. In some embodiments, the voids 3810 may be filled with a high-k dielectric material to form a top electrode 3902 in order to increase the 3D DRAM capacitance while still maintaining structural support of the lower electrode 3820. A cross-sectional view 3900 of FIG. 39 depicts the capacitor structure 3806 and the lower electrode 3820 being supported at the first end 3824 by the sides 3822 of the support columns 3816 and supported at the second end 3826 by the silicon 3828. The top electrode 3902 and the lower electrode 3820 are separated by a capacitor dielectric layer 3904.

Figure 25:
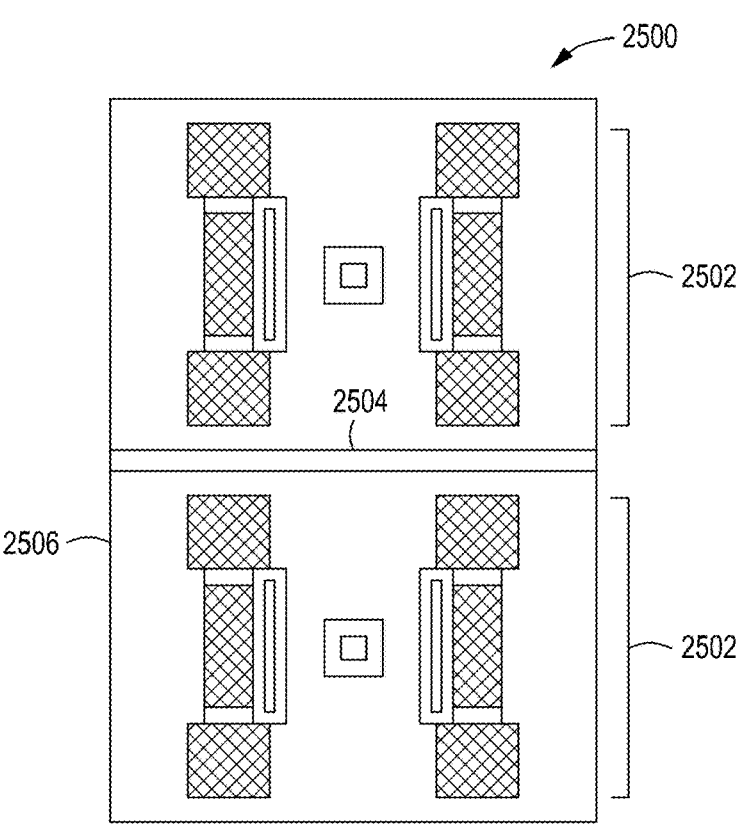
FIG. 25 depicts a top-down view of a bitline slit formed between two 3D DRAM transistors in accordance with some embodiments of the present principles.
Figure 26:
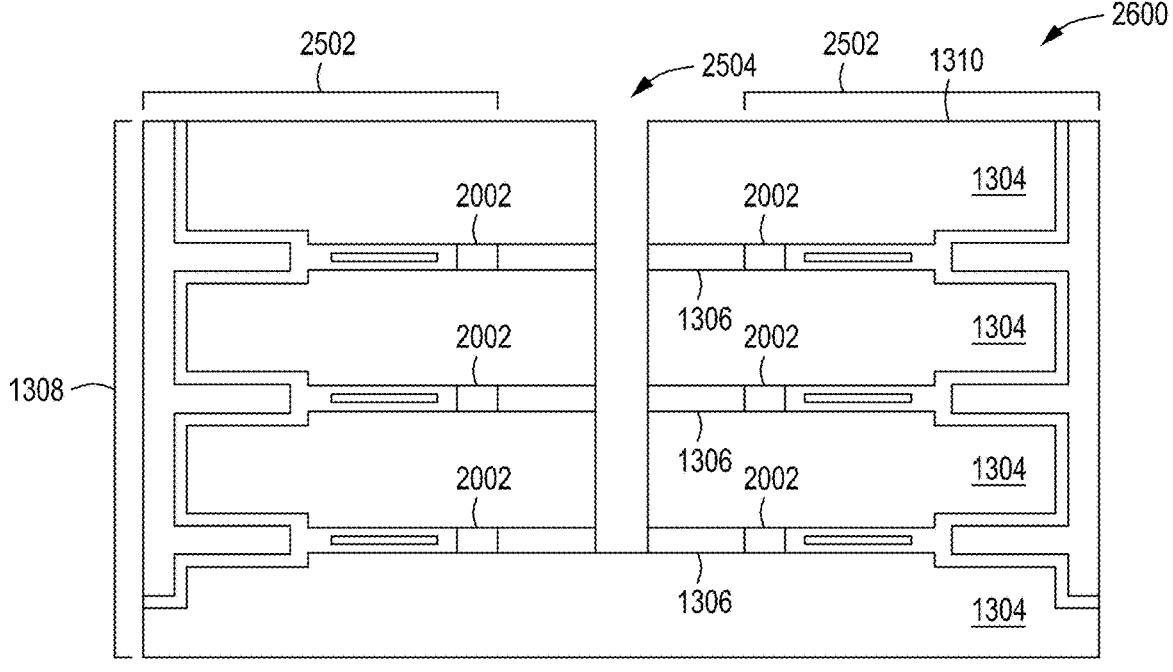
FIG. 26 depicts a cross-sectional view of a bitline slit formed in a silicon/silicon germanium stack in accordance with some embodiments of the present principles.
Figure 27:
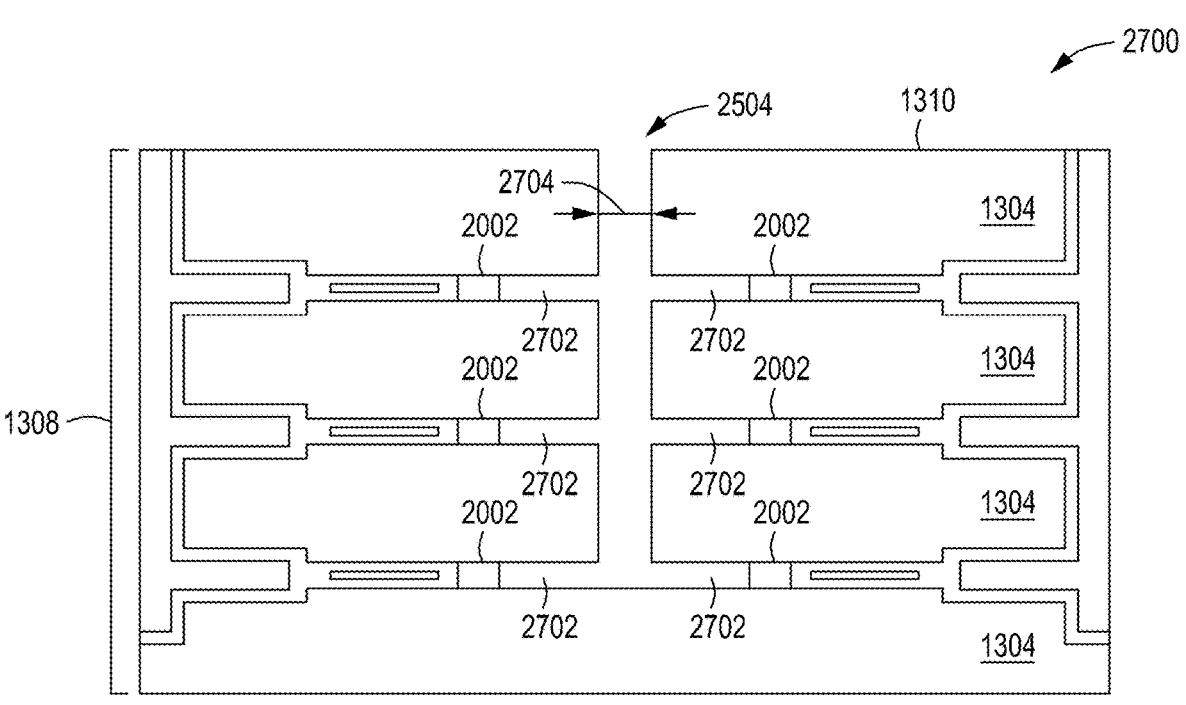
FIG. 27 depicts a cross-sectional view of silicon germanium and source/drain doping region removal in accordance with some embodiments of the present principles.
Figure 28:
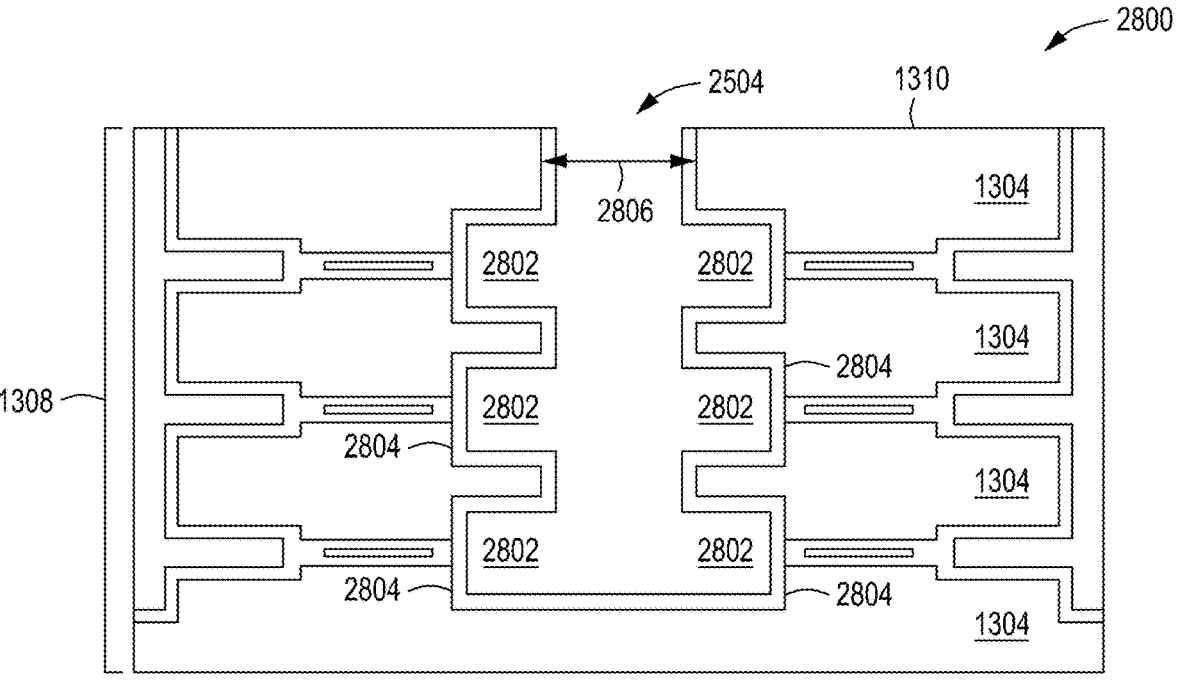
FIG. 28 depicts a cross-sectional view of etching to widen and heighten lateral channels of a bitline feature along with widening of the bitline feature and deposition of a first dielectric layer in accordance with some embodiments of the present principles.
Figure 29:
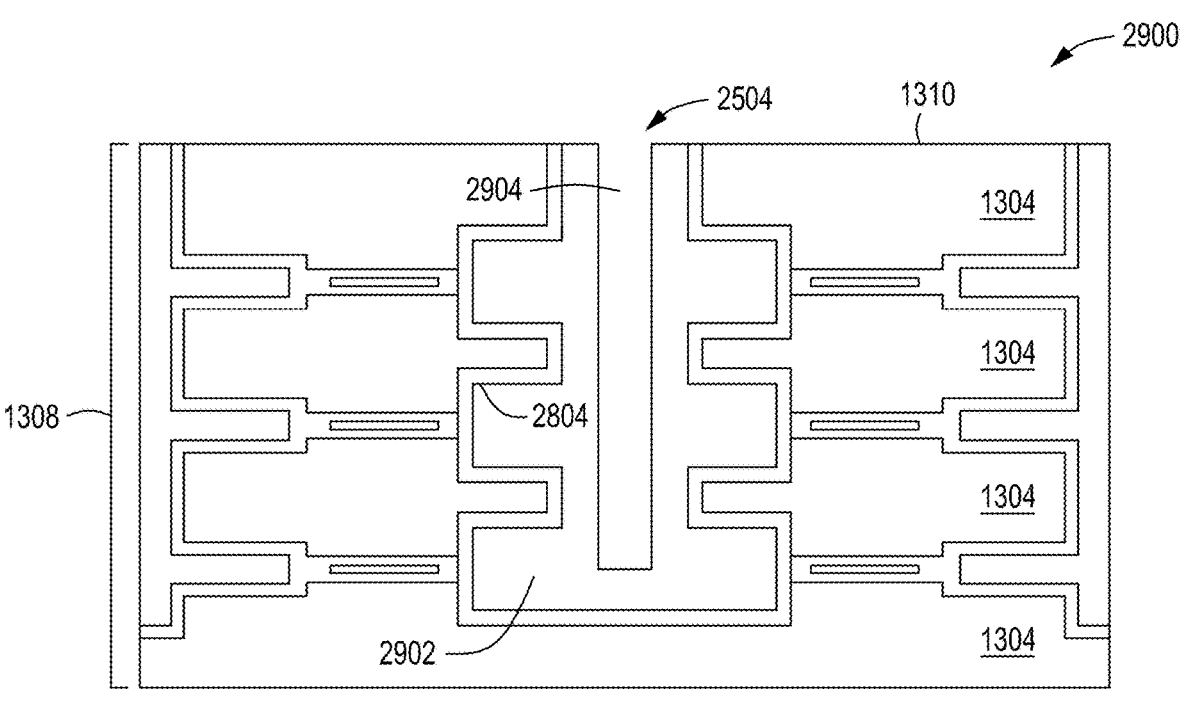
FIG. 29 depicts a cross-sectional view of deposition of a second dielectric layer to isolate the bitline feature in accordance with some embodiments of the present principles.
Figure 30:
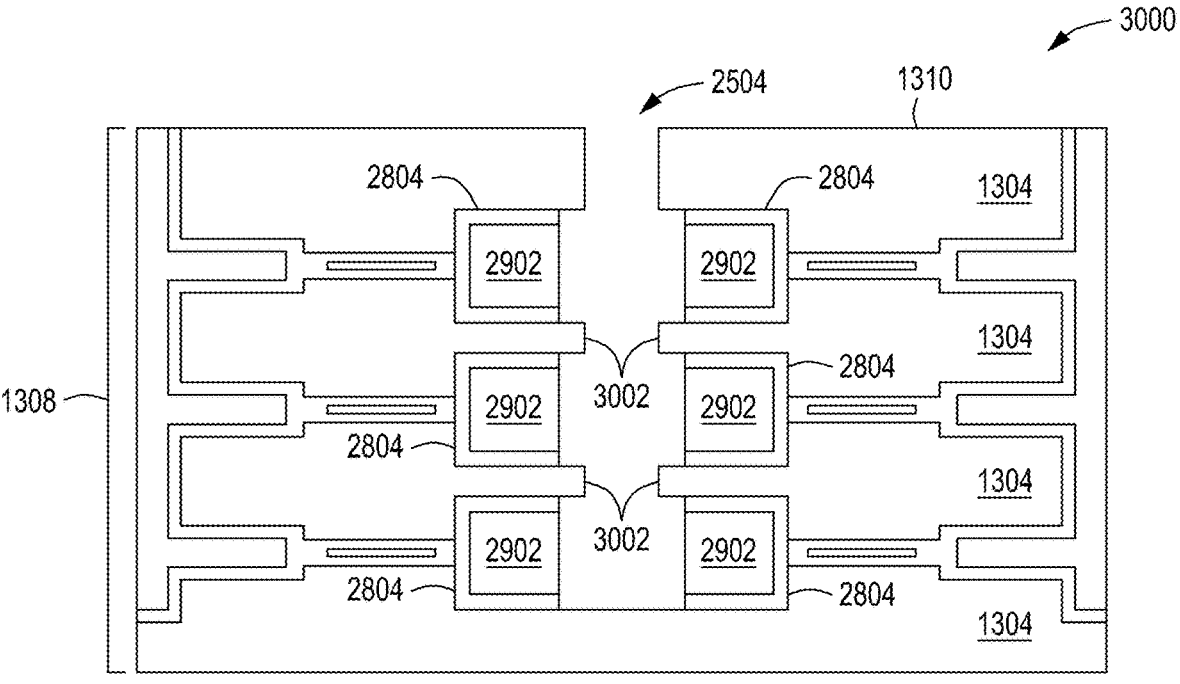
FIG. 30 depicts a cross-sectional view of silicon tip formation in a bitline feature in accordance with some embodiments of the present principles.
Figure 31:
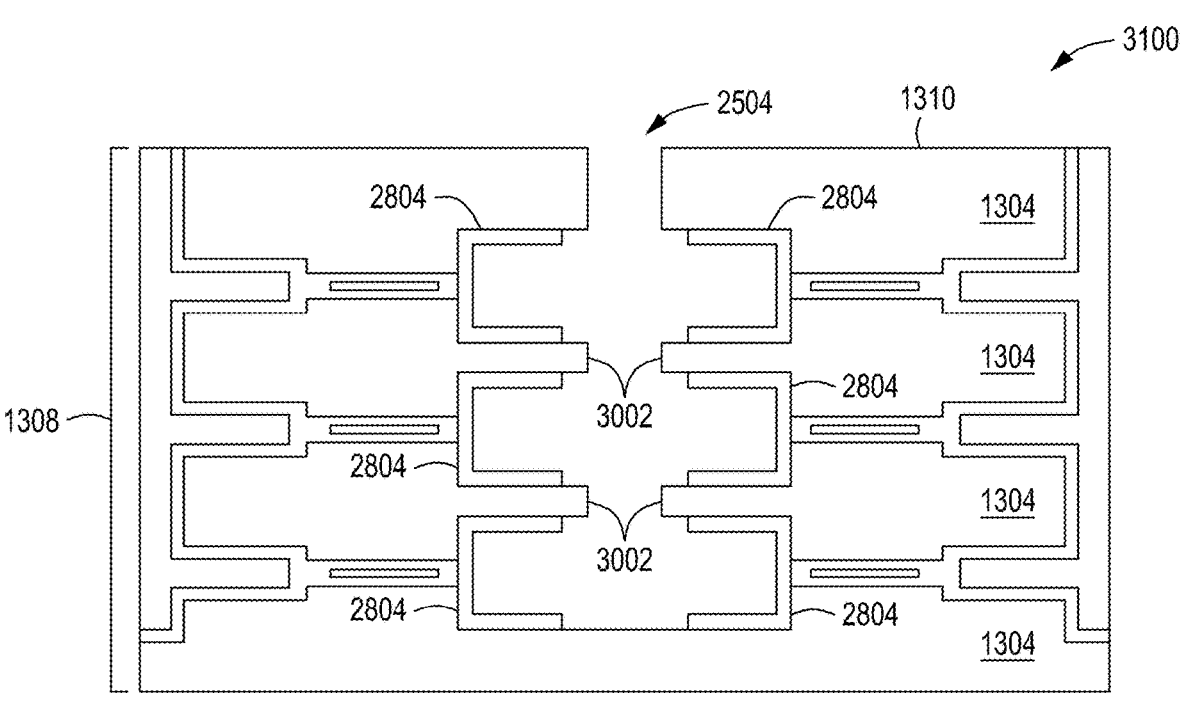
FIG. 31 depicts a cross-sectional view of removing a second dielectric layer in the isolation gaps in a bitline feature in accordance with some embodiments of the present principles.
Figure 32:
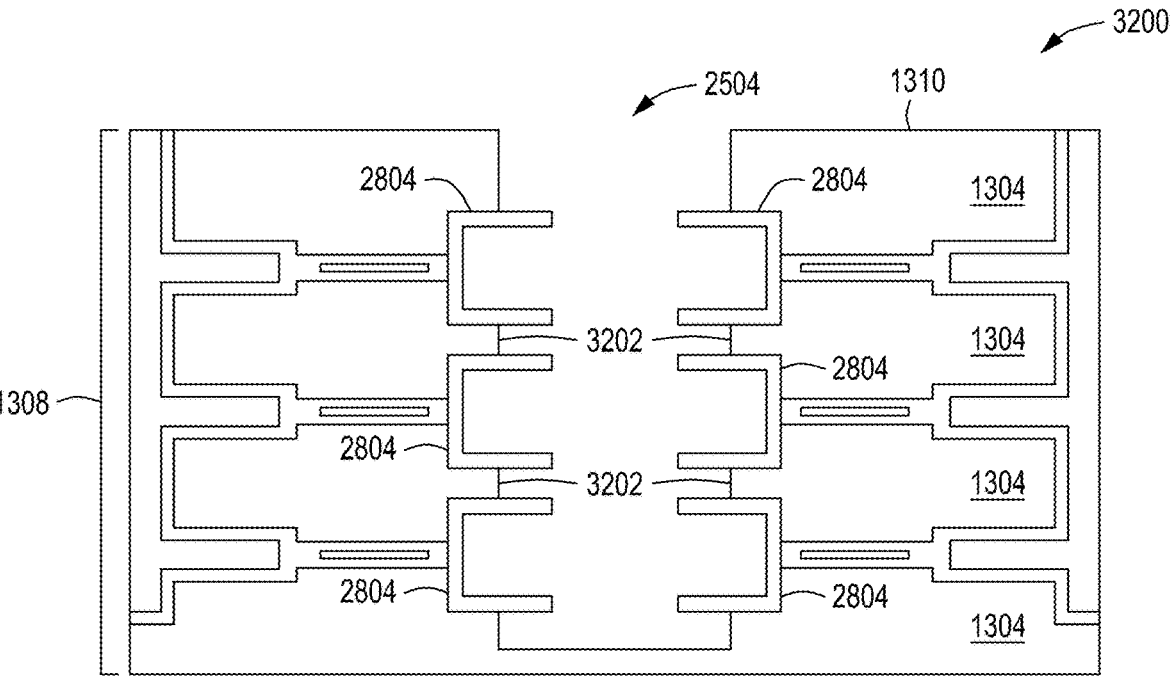
FIG. 32 depicts a cross-sectional view of silicon recess formation in a bitline feature in accordance with some embodiments of the present principles.

In block 4108 of FIG. 41, the bitline feature of the 3D DRAM is formed. Reference to FIGS. 25 to 37 and 40 will be made to illustrate the formation of the horizontal bitline feature 4004 of FIG. 40 of the 3D DRAM. In a top-down view 2500 of FIG. 25, two 3D DRAM transistors 2502 (vertical wordline features) have been formed in a substrate 2506 using methods as described above. A bitline slit 2504 is then formed between the two 3D DRAM transistors. As depicted in a cross-sectional view 2600 of FIG. 26, the bitline slit 2504 runs from the top surface 1310 down into the Si/SiGe stack 1308. In some embodiments, an anisotropic etch is used to form the bitline slit 2504. In some embodiments, an isotropic etch is used in conjunction with a hardmask for form the bitline slit 2504. The Si/SiGe stack 1308 is then etched through the bitline slit 2504 to selectively remove any remaining portions of the SiGe layer 1306 as depicted in a cross-sectional view 2700 of FIG. 27. The removal of the SiGe layers 1306 exposes the source/drain doping regions 2002 of the two 3D DRAM transistors 2502.

A silicon etching process is then performed on all surfaces to widen and heighten the lateral channels 2702 to form gaps for isolation of the bitline feature. During the silicon etching process, the bitline slit 2504 is also widened from a first width 2704 to a second width 2806. The source/drain doping regions 2002 of the two 3D DRAM transistors are then removed via etching, leaving isolation gaps 2802 as depicted in a cross-sectional view 2800 of FIG. 28. A first dielectric layer 2804, such as but not limited to, a nitride layer, is deposited using an ALD deposition process onto the surfaces of the bitline slit 2504 to form a thin layer. A second dielectric layer 2902 is then deposited on the first dielectric layer to isolate the bitline feature, filling the isolation gaps 2802 but leaving a space 2904 in the bitline slit 2504 as depicted in a cross-sectional view 2900 of FIG. 29. The space 2904 allows chemistry to access the inner surfaces of the bitline slit 2504 for further processing.

The second dielectric layer 2902 is then etched to expose the first dielectric layer 2804, leaving some of the second dielectric layer 2902 within the isolation gaps 2802. In some embodiments, a partial etch of the second dielectric layer 2902 may be achieved using an isotropic etch to expose the first dielectric layer 2804 or the bitline slit may be patterned and an anisotropic etch may be used to remove the second dielectric layer 2902 to expose the first dielectric layer 2804. The first dielectric layer 2804 is then partially etched back such that silicon tips 3002 are formed between the isolation gaps 2802 as depicted in a cross-sectional view 3000 of FIG. 30. In some embodiments, the remaining portions of the second dielectric layer 2902 in the isolation gaps 2802 are removed as depicted in a cross-sectional view 3100 of FIG. 31. In an alternative embodiment, the remaining portions of the second dielectric layer 2902 in the isolation gaps 2802 may be left in place (not shown) and covered over to function have a similar function as an air isolation gap. The silicon tips 3002 are then etched back to form recesses 3202 using an etch that is selective to silicon over the material used for the first dielectric layer 2804 as depicted in a cross-sectional view 3200 of FIG. 32.

Figure 33:
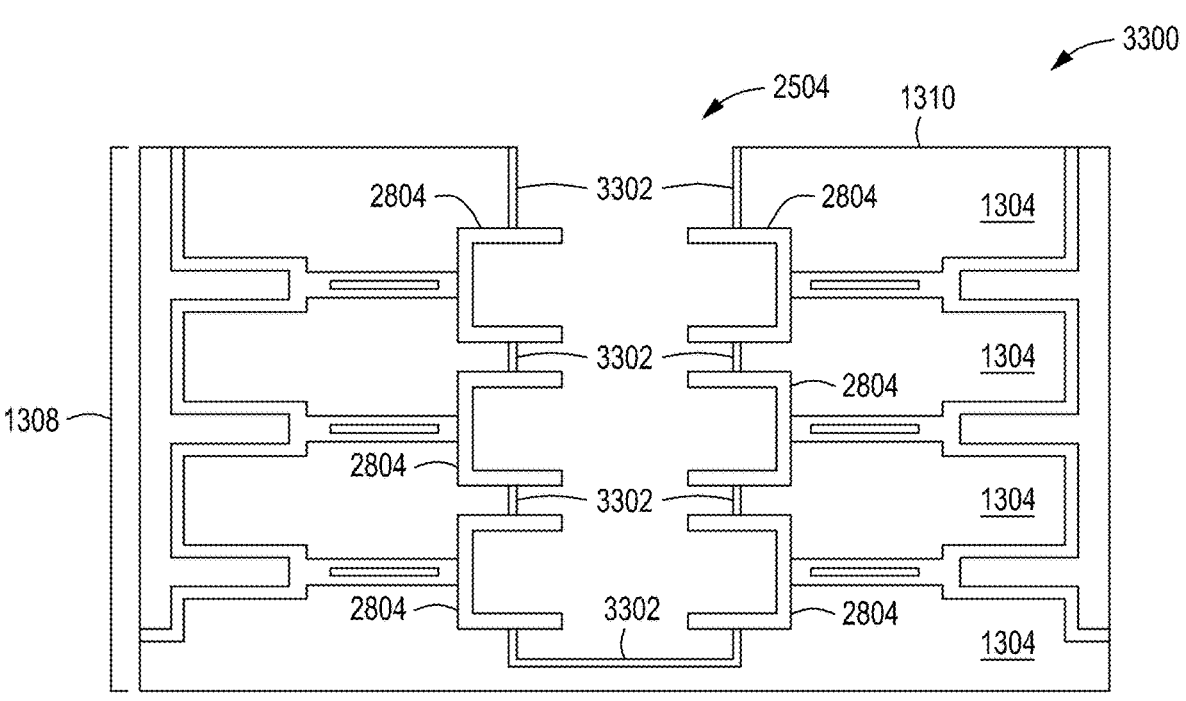
FIG. 33 depicts a cross-sectional view of ohmic contact formation in a bitline feature in accordance with some embodiments of the present principles.
Figure 34:
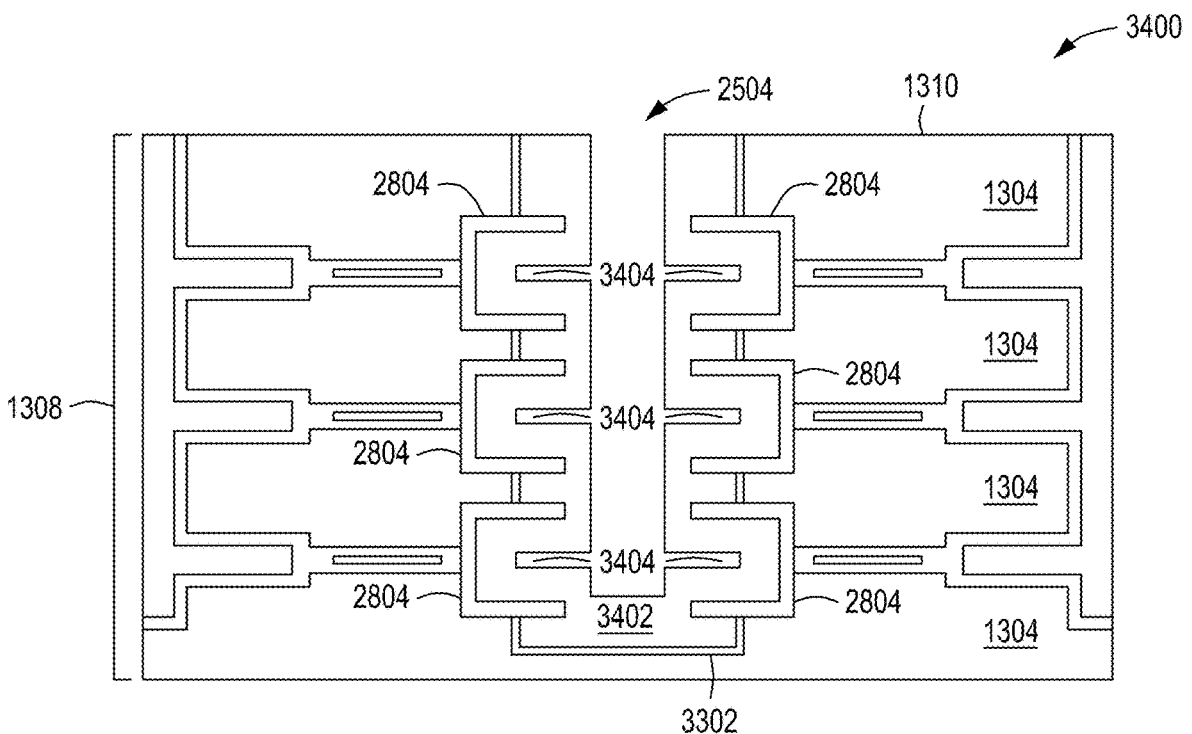
FIG. 34 depicts a cross-sectional view of depositing titanium nitride/tungsten layer in a bitline feature in accordance with some embodiments of the present principles.
Figure 35:
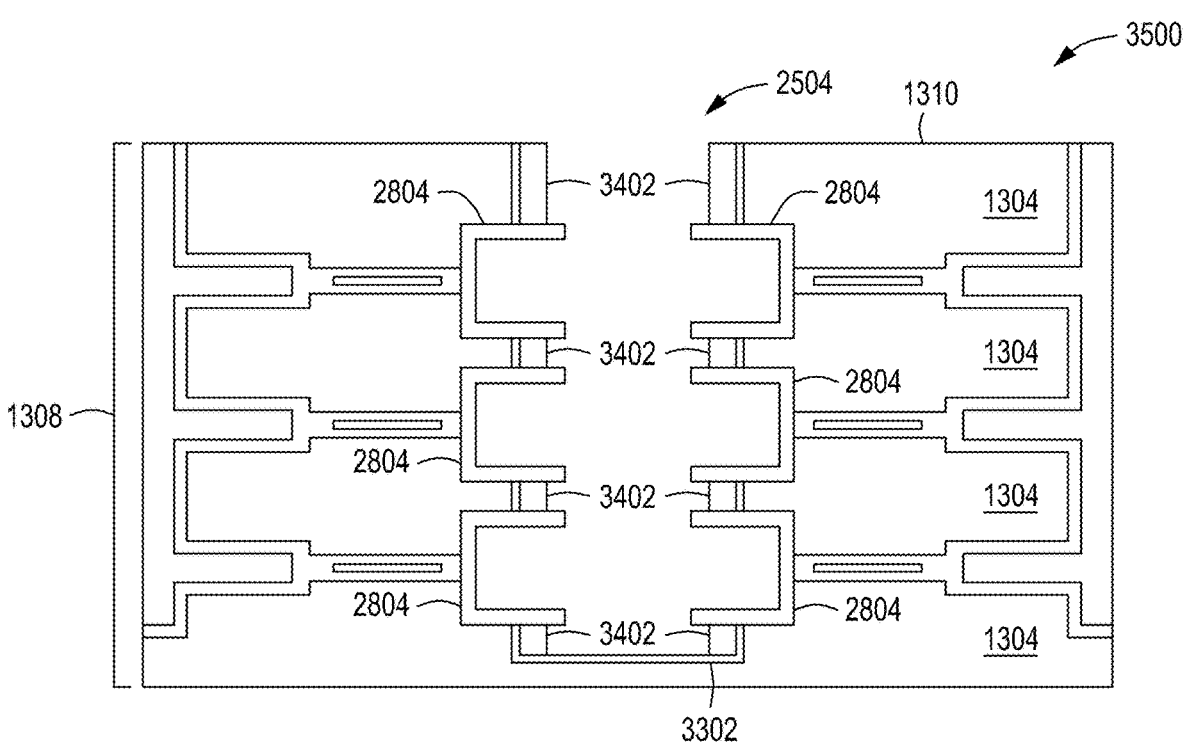
FIG. 35 depicts a cross-sectional view of etching back the titanium nitride/tungsten layer in a bitline feature in accordance with some embodiments of the present principles.
Figure 36:
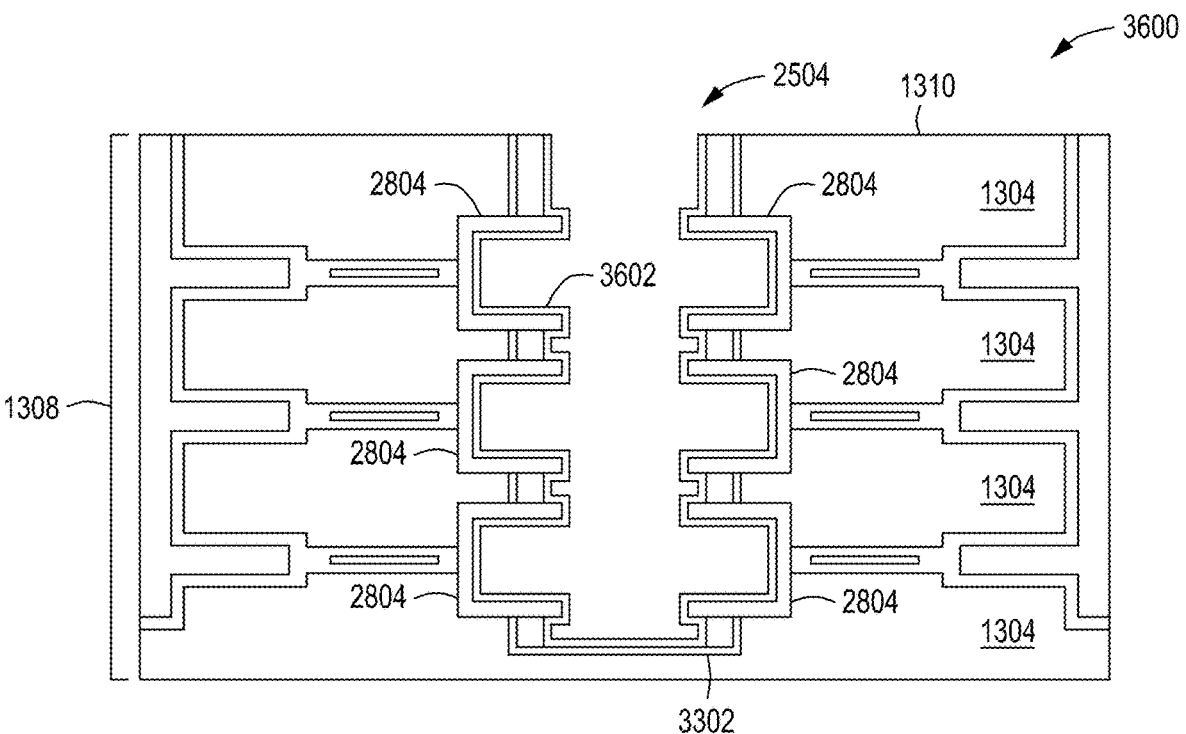
FIG. 36 depicts a cross-sectional view of dielectric barrier layer formation in a bitline feature in accordance with some embodiments of the present principles.
Figure 37:
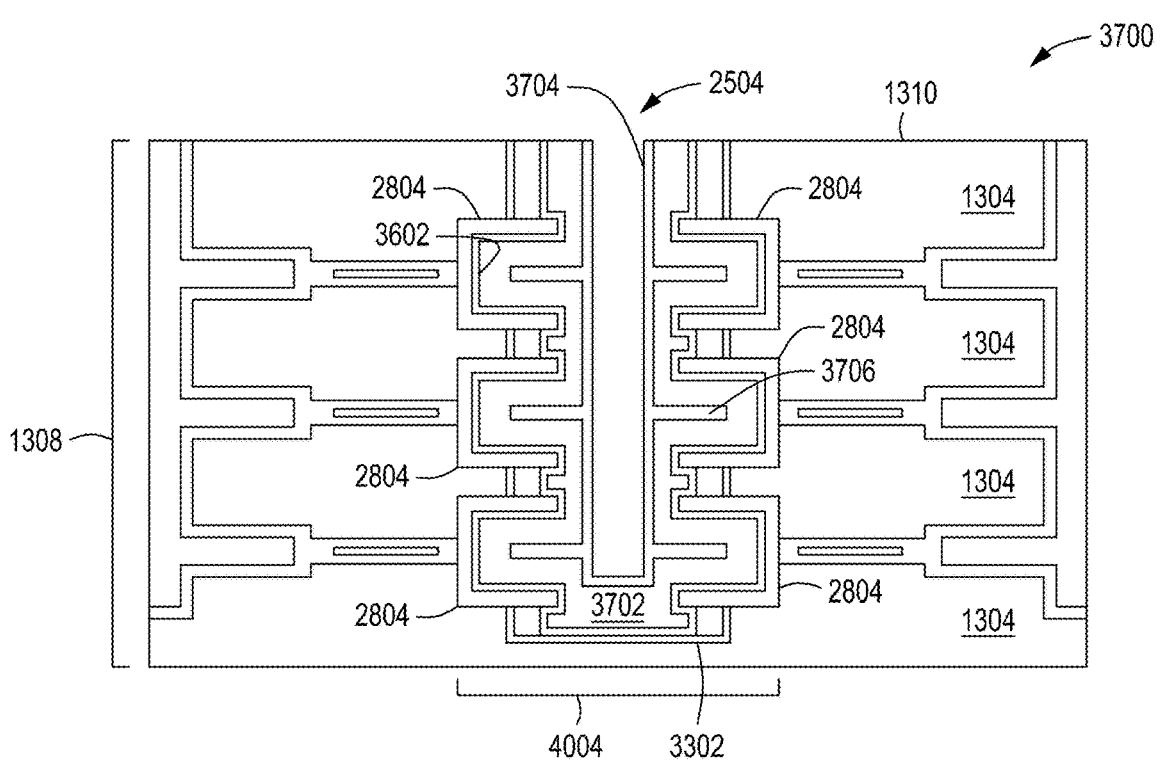
FIG. 37 depicts a cross-sectional view of deposition of a third dielectric layer formation and a conductive shield formation between bitline features in accordance with some embodiments of the present principles.

A titanium silicon phosphorous (TiSiP) layer 3302 is then selectively deposited on the silicon to form an ohmic contact between a subsequently deposited titanium nitride (TiN)/tungsten (W) layer and the silicon using an ALD deposition process as depicted in a cross-sectional view 3300 of FIG. 33. The TiSiP layer 3302 functions as a doping process. The TiN/W layer 3402 is deposited on all surfaces in the bitline slit 2504 such that the recesses 3202 are filled but the isolation gaps 2802 are not completely filled, leaving a horizontal space 3404 for chemistry access during subsequent processing as depicted in a cross-sectional view 3400 of FIG. 34. The TiN/W layer 3402 is then etched back from the isolation gaps 2802 but remains in the recesses 3202 as depicted in a cross-sectional view 3500 of FIG. 35. Residuals of the TiN/W layer 3402 in the isolation gaps 2802 after the etch back process do not affect performance of the 3D DRAM structure. A dielectric barrier layer 3602 is then deposited on the surfaces in the bitline slit 2504 as depicted in a cross-sectional view 3600 of FIG. 36. The dielectric barrier layer 3602 may be, but is not limited to, a nitride barrier layer and the like. A third dielectric layer 3702, such as, but not limited to, an oxide layer and the like, is deposited on the surfaces of the bitline slit 2504 such that a space 3706 remains inside of the isolation gaps 2802 to allow for filling with a subsequent deposition of a conductive shield layer 3704 as depicted in a cross-sectional view 3700 of FIG. 37. The conductive shield layer 3704 is then deposited using an ALD process such that the conductive shield layer 3704 is deposited on the third dielectric layer 3702 and fills the space 3706 within the isolation gaps 2802. The conductive shield layer 3704 functions as a shield to reduce noise coupling between the bitlines, completing the horizontal bitline feature 4004.

Figures 42, 43:
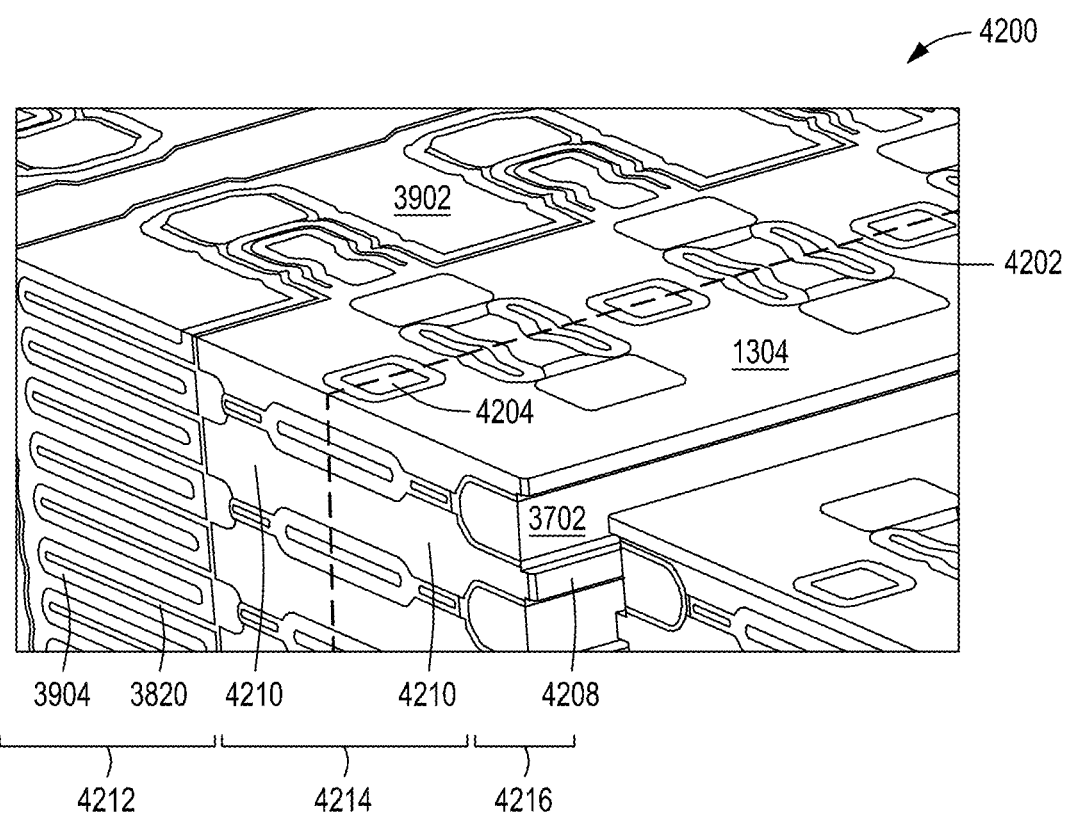
FIG. 42 depicts an isometric view of a 3D DRAM structure in accordance with some embodiments of the present principles.
FIG. 43 depicts an isometric view of gate all-around formation of wordline transistors in accordance with some embodiments of the present principles.
Figure 44:
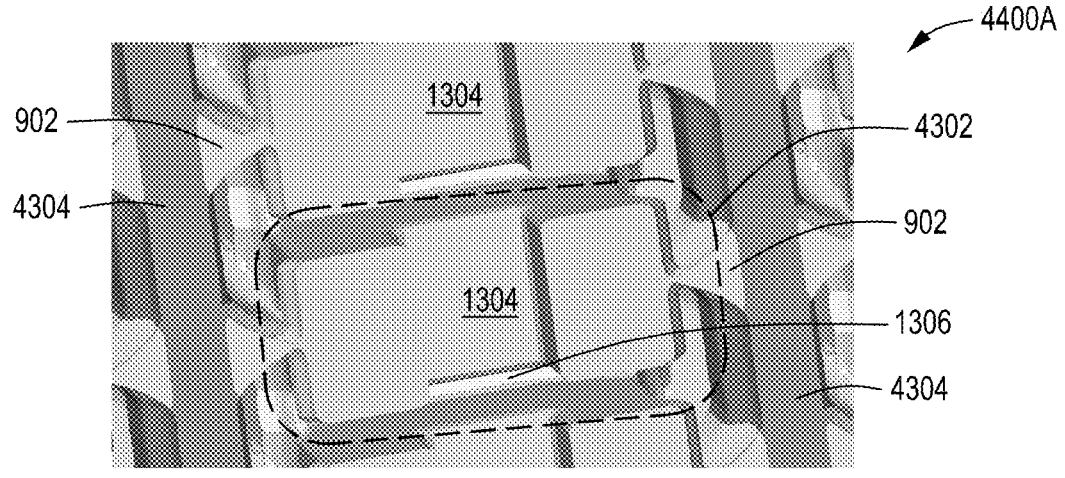
FIG. 44 depicts an isometric view of gate all-around formation of wordline transistors processing for channel reveal, channel thinning, and gate dielectric formation in accordance with some embodiments of the present principles.
Figure 44:
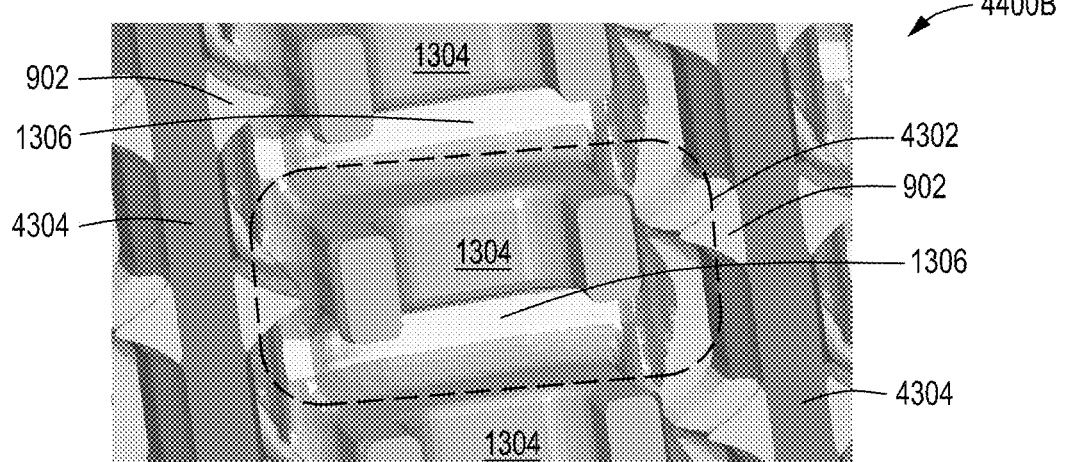
Figure 44:
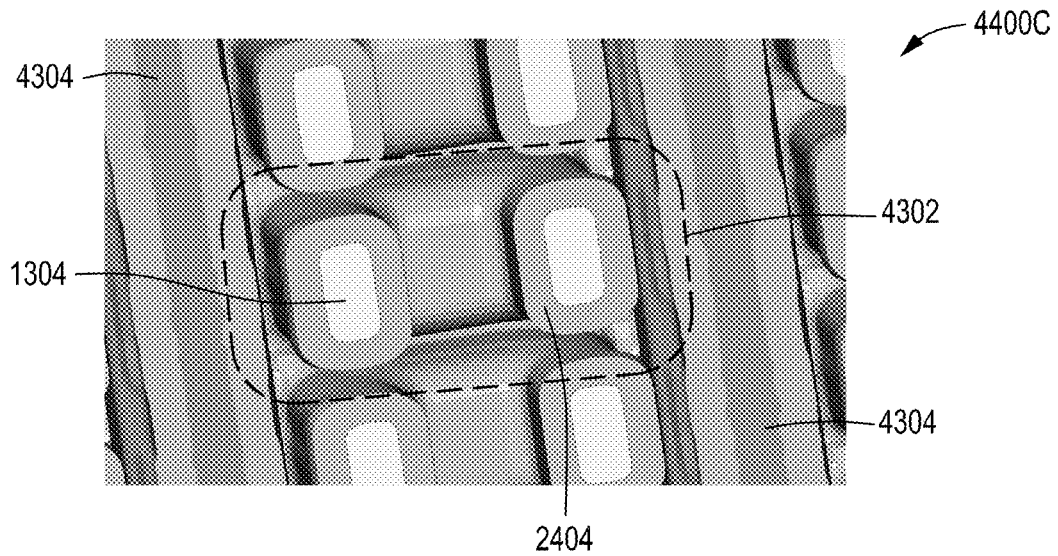

FIG. 42 depicts an isometric view 4200 of a 3D DRAM structure in accordance with some embodiments. A capacitor section 4212 is connected to a wordline feature section 4214 which connects with a horizontal bitline feature section 4216. The wordline feature section 4214 includes two source/drain regions 4210. A cut line 4202 is shown in an isometric view 4300 of FIG. 43 to illustrate the internal structure of the 3D DRAM structure through the wordline feature. The wordline hole 4204 is central to a channel and forms two GAA channels 4302 in each intersection of the vertical wordline feature 4306 and the horizontal bitline feature 4208. The vertical wordline features 4306 are separated by isolation features 4304. As the processes described above for formation of the wordline feature are performed, the GAA channels 4302 are also formed. The following description illustrates the formation of the GAA channels 4302 during the above wordline feature processes from different perspectives. Formation of the GAA channels 4302 is depicted in a first isometric view 4400A, a second isometric view 4400B, and a third isometric view 4400C of FIG. 44. In the first isometric view 4400A, SiGe layers 1306 have been etched back until reaching the isolating features 4304 as described previously (the dielectric 1104 acts as an etch stop). The etch back process also removes a portion of the low temperature oxide layers 902 that was previously deposited in the isolation features 4304 as described above. In the second isometric view 4400B, the silicon layers 1304 have also been etched to increase the gap space, and in doing so, additional portions of the low temperature oxide layers 902 are removed, forming space all around the GAA channels 4302. In the third isometric view 4400C, the gate oxide layer 2404 has been formed in the wordline feature, surrounding the GAA channels 4302. The space surrounding the GAA channels and gate oxide layer 2404 are subsequently filled with gate electrode material as described above for the wordline feature.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming a three-dimensional dynamic random-access memory (3D DRAM) structure, comprising:

depositing alternating layers of crystalline silicon (c-Si) material and crystalline silicon germanium (c-SiGe) material using a heteroepitaxy process onto a substrate; and etching of a pattern of holes with at least one high aspect ratio (HAR) hole into the substrate, the pattern of holes configured to provide chemistry access to the alternating layers of c-Si material and c-SiGe material to laterally etch or deposit materials to form 3D DRAM features of the 3D DRAM structure without subsequent HAR etching of holes in the substrate to form the 3D DRAM features.

2. The method of claim 1, further comprising:

merging a portion of the pattern of holes formed by etching material between the portion of the pattern of holes to form an active area isolation slot of the 3D DRAM structure.

3. The method of claim 1, further comprising:

depositing different materials in different holes to block or allow a lateral or a vertical recess process for 3D DRAM cell formation.

4. The method of claim 1, further comprising:

forming an isolation slot which has a liner of a first dielectric material which is removable by exposure to hydrogen fluoride (HF) and which has ends filled with a second dielectric material impervious to HF, the isolation slot configured to provide lateral cell isolation and give structure support to the 3D DRAM structure.

5. The method of claim 4, further comprising:

forming a lower electrode of a capacitor of the 3D DRAM structure that is supported at one or more ends of the isolation slot that are filled with the second dielectric material; and removing the liner of the first dielectric material of the isolation slot to provide space to fill with a high-k top electrode material for increased 3D DRAM cell capacitance of the 3D DRAM structure while maintaining structural support of the lower electrode.

6. The method of claim 1, further comprising:

etching the pattern of holes using a mask and etching process that etches both c-Si material and c-SiGe material.

7. The method of claim 1, further comprising:

selectively etching the c-SiGe material from inside the at least one HAR hole to form a lateral feature extending from a sidewall of the at least one HAR hole.

8. The method of claim 7, further comprising:

selectively etching the c-Si material in the at least one HAR hole to increase a size of the at least one HAR hole and a height of the lateral feature; or etching the c-Si material and the c-SiGe material in the at least one HAR hole to increase a size of the at least one HAR hole, a height of the lateral feature, and a width of the lateral feature that extends into the c-SiGe material.

9. A method for forming a three-dimensional dynamic random-access memory (3D DRAM) structure, comprising:

depositing alternating layers of crystalline silicon (c-Si) material and crystalline silicon germanium (c-SiGe) material using a heteroepitaxy process on a substrate;

etching of a pattern of holes with at least one high aspect ratio (HAR) hole into the substrate, the pattern of holes configured to provide chemistry access to the alternating layers of c-Si material and c-SiGe material to laterally etch or deposit materials to form 3D DRAM features of the 3D DRAM structure without subsequent HAR etching of holes in the substrate to form the 3D DRAM features;

merging a portion of the pattern of holes formed by etching material between the portion of the pattern of holes to form slot features of the 3D DRAM structure;

forming an isolation slot from at least one slot feature which has a liner of a first dielectric material which is removable by exposure to hydrogen fluoride (HF) and which has ends filled with a second dielectric material impervious to HF, the isolation slot configured to provide lateral cell isolation and give structure support to the 3D DRAM structure;

forming a lower electrode of a capacitor of the 3D DRAM structure that is supported at one or more ends of the isolation slot that are filled with the second dielectric material; and removing the liner of the first dielectric material of the isolation slot to provide space to fill with a high-k top electrode material for increased 3D DRAM cell capacitance while maintaining structural support of the lower electrode.

10. The method of claim 9, further comprising:

etching a wordline hole between two isolation slots to form a wordline structure;

selectively etching the c-SiGe material through a top opening of the wordline hole to form lateral wordline features extending to the two isolation slots;

forming a source/drain and spacer of the 3D DRAM structure by extending the lateral wordline features until limited by the two isolation slots;

depositing a conformal layer of doped oxide in the wordline hole;

etching back the conformal layer of doped oxide to leave doped regions for a source/drain of the 3D DRAM structure;

depositing a gate oxide layer in the wordline hole; and depositing a gate electrode to fill the wordline hole.

11. The method of claim 10, further comprising:

anisotropically etching a slit between two wordline structures to form a bitline structure;

selectively etching c-SiGe material laterally in the slit from a top opening of the slit;

forming the bitline structure by chemically depositing and etching from the top opening of the slit; and forming a conductive shield layer in the bitline structure to reduce noise coupling between multiple bitlines.

12. The method of claim 9, further comprising:

etching the pattern of holes using a mask and etching process that etches both c-Si material and c-SiGe material.

13. The method of claim 9, further comprising:

selectively etching the c-SiGe material from inside the at least one HAR hole to form a lateral feature extending a sidewall of the at least one HAR hole.

14. The method of claim 13, further comprising:

selectively etching the c-Si material in the at least one HAR hole to increase a size of the at least one HAR hole and a height of the lateral feature; or etching the c-Si material and the c-SiGe material in the at least one HAR hole to increase a size of the at least one HAR hole, a height of the lateral feature, and a width of the lateral feature that extends into the c-SiGe material.

15. The method of claim 9, further comprising:

depositing different materials in different holes to block or allow a lateral or a vertical recess process for 3D DRAM cell formation.

\* \* \* \* \*